United States Patent [19]

Liebmann et al.

[11] Patent Number: 5,795,685
[45] Date of Patent: Aug. 18, 1998

[54] SIMPLE REPAIR METHOD FOR PHASE SHIFTING MASKS

[75] Inventors: Lars W. Liebmann, Poughquag, N.Y.; Burn Jeng Lin, Tampa, Fla.; Mark O. Neisser, Wappingers Falls, N.Y.

[73] Assignee: International Business Machines Corporation, Armonk, N.Y.

[21] Appl. No.: 783,631

[22] Filed: Jan. 14, 1997

[51] Int. Cl.$^6$ .................................................. G03F 9/00
[52] U.S. Cl. ............................................................ 430/5
[58] Field of Search ................................. 430/5; 364/490; 395/500; 356/390

[56] References Cited

U.S. PATENT DOCUMENTS

| | | | |
|---|---|---|---|
| 5,418,092 | 5/1995 | Okamoto | 430/5 |
| 5,464,713 | 11/1995 | Yoshioka et al. | 430/5 |
| 5,468,578 | 11/1995 | Rolfson | 430/5 |
| 5,472,813 | 12/1995 | Nakagawa | 430/5 |
| 5,472,814 | 12/1995 | Lin | 430/5 |
| 5,481,473 | 1/1996 | Kim et al. | 364/490 |
| 5,497,334 | 3/1996 | Russell et al. | 364/489 |
| 5,523,186 | 6/1996 | Lin et al. | 430/5 |
| 5,553,273 | 9/1996 | Liebmann | 395/500 |
| 5,553,274 | 9/1996 | Liebmann et al. | 395/500 |

FOREIGN PATENT DOCUMENTS 7-077796  3/1995  Japan.

*Primary Examiner*—S. Rosasco
*Attorney, Agent, or Firm*—Schmeiser, Olsen & Watts; Steven Capella

[57] ABSTRACT

A method and apparatus for correcting defects in a phase shift mask to be used in photolithography. More specifically, the method of the invention includes creating a second repair mask which contains phase shifters. Regions surrounding the defects on the first mask are made opaque. The design circuitry located in these defective regions is copied onto the second mask. During a second exposure the design circuitry is placed onto the semiconductor wafer. Therefore, this method and apparatus provides an inexpensive solution to a difficult problem.

47 Claims, 17 Drawing Sheets

SIMPLE REPAIR METHOD FOR PHASE SHIFTING MASKS

BACKGROUND OF THE INVENTION

1. Technical Field

The present invention relates to optical lithography systems. More particularly, this invention relates to a method and apparatus for correcting defects in a phase shift mask using a repair phase shift mask.

2. Background Art

Manufacturers in the field of integrated circuits (ICs) have been trying to reduce the geometric size of the devices (e.g. transistors or polygates) present on integrated circuits. The benefits achieved in reducing device dimensions include higher performance and smaller packaging sizes. However, numerous limitations arise as manufacturers attempt to achieve smaller and smaller device sizes. One primary problem manufacturers face is that as smaller devices are sought, the precision required from the tools used to create IC devices increases.

One of the first steps in manufacturing integrated circuit chips involves the laying out or designing of the circuits to be packaged on a chip. Most integrated circuits are designed using computer aided design (CAD) layout tools. CAD layout tools allow chip manufacturers to plan the layout of the circuits on a computer where they can be analyzed and stored. Once this step is finished, the designs need to be transferred onto the chip.

Photolithography is a well known technique used to apply patterns on the surface of a workpiece, such as a circuit pattern to a semiconductor chip or wafer, and which is also capable of producing very small, intricate patterns for many other applications. Traditional photolithography involves applying electromagnetic radiation to a mask having openings formed therein such that the light or radiation that passes through the openings is applied to a region on the surface of the workpiece. In general, masks typically comprise a transparent substrate on which various "circuit" patterns, determined by a CAD system, are disposed. That "circuit" pattern is then transferred onto the surface of a silicon wafer. The transfer of the pattern from the mask to the silicon substrate is accomplished by passing visible, ultraviolet, or even x-ray radiation (e.g., light) through the mask and onto the silicon substrate containing a photoresist material. Because the mask contains a pattern made up of solid lines and clear space, only those areas made up of clear space will allow radiation to pass. This process results in the creation of devices on the silicon substrate.

FIG. 1(a) shows a cross-sectional view of a conventional mask 10 made of quartz with a circuit design image in chrome 11. This is referred to as a "chrome on glass" or binary mask. FIG. 1(b) shows a graph of the electric field formed on the mask. FIG. 1(c) shows a graph of an electric field on the wafer. FIG. 1(d) shows a graph of the light intensity on the resist film on the wafer.

The minimum dimensions of circuits formed by photolithographic processes generally decrease as improvements in semiconductor manufacturing processes occur. Improving photolithography technology provides improved resolution, resulting in a potential reduction of the minimum dimensions of and spaces between electromagnetic radiation application regions where electromagnetic radiation is applied through the mask.

Recent improvements in photolithographic masks often involve phase shifting techniques, in which certain of the openings, or portions of openings, are phase shifted with respect to adjacent openings. An article by B. J. Lin in the "10th Annual Symposium on Microlithography 1990", SPIE, Vol. 1496, pp. 59–63, discusses the various phase shifting techniques. The article is hereby incorporated by reference.

An example of alternating phase shifting is shown in FIG. 2(a). Alternating phase shifting provides a means by which every other element in a closely packed array of circuit elements is phase shifted which leads to enhancement of the edge contrast. The openings in the mask are typically configured in an array of openings which are alternately phase shifted, and non-phase shifted, along two perpendicular axes of the mask. FIG. 2(a) shows a cross-sectional view of the phase shifting openings 12 and the non-phase shifting openings 13. The electromagnetic radiation that passes through the phase shifting openings interferes destructively in the spaces with the electromagnetic radiation passing through the non-shifting openings, and thereby reduces the intensity of electromagnetic radiation within the unaffected spaces. FIG. 2(b) shows a graph of the electric field on the mask. FIG. 2(c) shows a graph of the electric field on the wafer. FIG. 2(d) shows a graph of the light intensity on the wafer.

While alternating phase shifting techniques improve the resolution of photolithographic masks in many layout configurations, it requires closely packed patterns to be effective. The alternating phase shifting process functions best when the opening pattern formed on each mask is regular and repeatable. However, when the openings are not closely packed, other widely known techniques such as subresolution, rim, attenuated, unattenuated and phase edge phase shifting techniques can be used to increase resolution or improve dimensional control.

For example, in order to phase shift isolated openings such as contact holes and line openings, subresolution phase shifters can be introduced. The characteristics of a conventional mask as shown in FIG. 3(a) can be compared to the characteristics of a subresolution phase shifting mask as shown in FIGS. 4(a). FIG. 3(a) shows a top view of the conventional mask and FIG. 3(b) shows a cross-sectional view of the conventional mask. FIG. 3(c) shows a graph of an electric field on a mask. FIG. 3(d) shows a graph of an electric field on a wafer. FIG. 3(e) shows the light intensity on the wafer. FIG. 4(a) shows a top view of the subresolution phase shift mask with patterns below the resolution limit of the given optical system, and thus, cannot be printed. Their sole function is to provide phase shifting to enhance the edge contrast of the pattern of interest. FIG. 4(b) shows a side view of the subresolution phase shifting mask with phase shifting openings 14 and nonphase shifting openings 15. FIG. 4(c) shows a graph of an electric field on the mask. FIG. 4(d) shows a graph of an electric field on the wafer. FIG. 4(e) shows a graph of the light intensity on the wafer.

Subresolution and alternating phase shifting are still limited by the inability to phase shift opaque features. Rim phase shifting overcomes such problems and can be applied to an arbitrary mask design without extra postprocessing. A rim phase shifting mask is shown in FIG. 5(a). A conventional mask is first made, then a uniform layer of phase shifter is applied to the absorber side of the mask, followed with resist application, self-aligned imaging from the substrate side of the mask, delineation of the phase shifter, then undercutting of the absorber. Phase shifting 16 only takes place at the rim of the patterns. The center of the patterns is blocked by the absorber 17 to prevent large areas of negative amplitude which becomes undesirable positive intensity in the dark areas of the image. FIG. 5(b) shows a graph of the electric field on the wafer. FIG. 5(c) shows a graph of the electric field on the wafer. FIG. 5(d) shows a graph of the light intensity on the wafer.

In attenuated phase shifting, the dark areas of the mask can be phase shifted to 180 degrees but with an attenuated amplitude to prevent producing too much light in these areas. FIG. 6(a) shows this technique for the reflective case. Reflectors 18 and reflective phase shifters 19 combine to produce the negative amplitude which provides the desired improvement in image edge contrast and the attenuation prevents the negative amplitude from becoming a problem. FIG. 6(b) shows a graph of the electric field on the mask. FIG. 6(c) shows a graph of the electric field on the wafer. FIG. 6(d) shows a graph of the light intensity on the wafer.

In unattenuated phase shifting, shown in FIG. 7(a), a natural form of phase shifting takes advantage of spatial frequency doubling to the final image intensity so that the transparent phase shifters 20 can have half of the spatial frequency of a given periodic pattern. There is neither absorber nor attenuator on the mask. FIG. 7(b) shows a graph of the electric field on the mask. FIG. 7(c) shows a graph of the electric field on the wafer. FIG. 7(d) shows a graph of the light intensity on the wafer.

Phase edge shifting masks, as shown in FIG. 8(a), print lines by having a phase boundary on the mask. A phase boundary is a place where the light transmitted from one side of the boundary through the mask comes out a different phase from light transmitted on the other side of the boundary on the mask. The phase difference is typically 180 degrees. FIG. 8(b) shows a graph of the electric field on the mask. FIG. 8(c) shows a graph of the electric field on the wafer. FIG. 8(d) shows a graph of the light intensity on the wafer. In phase edge shifting, in an unattenuated phase shifting situation, the boundary between the phase shifter and the transparent background is transformed into a narrow dark line with an intensity as shown in FIG. 8(d). The amplitude having to pass through zero, insures a zero intensity. This dark line is extremely narrow and has a much higher contrast when compared to a dark line produced by a narrow opaque object without phase shifting.

FIG. 9(a) shows transparent (unattenuated) phase shifters 11a, 11b, 11c, and 11d on a transparent mask blank 10, where the shifters each have a different width. FIG. 9(b) shows the corresponding electric field on the mask. FIG. 9(c) shows the corresponding electric field at the wafer or substrate plane. FIG. 9(d) shows the corresponding image intensity at the wafer or substrate plane. As the unattenuated phase shifting region becomes smaller, the two shadows cast by its phase edges come closer together and eventually merge to become one dark feature. One can take advantage of this behavior and design subresolution or "chromeless" phase shift masks where narrow dark regions are created by a single phase edge or pairs of phase edges and large dark regions are created by arrays of phase edges, as shown in FIG. 10(a). FIG. 10(a) shows a mask with a large opaque region 13 and a small region 14 created by such a technique, where FIG. 10(b) is the electric field on the mask, FIG. 10(c) is the electric field at the wafer, and FIG. 10(d) is the radiation intensity at the wafer or substrate plane.

Described above are examples of phase shifting techniques for lithography resolution enhancement or improved dimensional control.

Although phase shift masks provide significant resolution and/or dimensional control enhancements over traditional binary (chrome on glass) masks, they are often difficult or impossible to repair. This is because mask repair techniques used for binary masks (masks with only opaque and clear regions, all of the same phase) only need to make clear areas totally opaque, or opaque areas 100% transparent with no phase adjustment. Repair of phase shift masks must also control phase and/or transmission of the radiation transmitting areas. Because it is highly unlikely that a photomask can be fabricated without any defect, the inability to repair phase shift masks is a major drawback. Typical defects include opaque defects in a clear region, clear defects in an opaque region, and phase defects. A phase defect is a defect where the mask transmits radiation in an area where it should transmit radiation, but of the wrong phase. Phase shifting defects can take the form of, for example, missing phase shifters, misplaced phase shifters, or phase errors. Such phase errors can vary significantly within small areas of the mask and provide unacceptable lithographic performance for the mask. The intensity as well as the phase of the repaired area have to be within an acceptable tolerance to preserve the desirable imaging performance of a perfect mask.

For many of these defects, it is often difficult or impossible to repair a damaged phase shift mask and the mask has to be replaced in its entirety. Since the probability of producing a defect free mask without a cost effective repair process is low (for state of the art circuit patterns), many phase shift masks have to be made to obtain a good one, leading to unacceptable mask cost and/or turnaround time. U.S. Pat. No. 5,464,713 issued to Yoshioka et al. on Nov. 7, 1995, and assigned to Mitsubishi Denki Kabushiki Kaisha and Dainippon Printing Co., Ltd., describes a repair method of a phase shift mask. Yoshioka et al. involves repair of phase defects made on the same mask on which the defect is found instead of another mask. A repair process such as this requires expensive tooling dedicated to repair. Also, tooling that is currently available cannot deal effectively with phase shift defects of nonuniform depth. Finally, repair of defects on the same mask involves relaxation of the phase and transmission control requirements for the mask in the area of the repair. This results in a degraded aerial image and reduced lithographic quality. The above mentioned patent is hereby incorporated by reference.

Therefore, previous routines have limitations associated with repairing phase shift masks used in the manufacture of semiconductor devices. More likely than not, repair of a damaged region using opaque techniques is quite limited, leading to the replacement of the damaged phase shift mask in its entirety, thereby, having attendant cost drawbacks.

Many phase shift techniques, such as alternating or phase edge techniques, require two exposures of the same photoresist area with different masks before developing the photoresist. This is because certain methods for increasing lithographic resolution or process control require a second exposure, either to remove unwanted features created by the first expose, or to put in additional features not created by the first exposure. For example, if a phase edge mask was used to create narrow lines in positive resist, a second ("trim") exposure might by needed to remove unwanted lines caused by unavoidable phase boundaries in the first reticle. Another example might be if one mask was used to expose isolated contacts and another for lines and spaces in the same layer of resist. Examples of such techniques are described in U.S. Pat. No. 5,424,154 issued to Borodovsky and assigned to Intel Corporation. U.S. Pat. No. 5,563,012 issued to Neisser and assigned to International Business Machines Corp., U.S. Pat. No. 5,472,814 issued to Lin on Dec. 5, 1995 and assigned to International Business Machines Corp., U.S. Pat.

No. 5,472,813 issued to Nakagawa et al. on Dec. 5, 1995 and assigned to Fujitsu Limited, and U.S. Pat. No. 5,418,092 issued to Okamoto on May 23, 1995 and assigned to Hitachi, Ltd. These patents describe methods of using two lithographic masks instead of one for exposing a resist film. The above mentioned patents are hereby incorporated by reference.

SUMMARY OF THE INVENTION

It has been discovered in accordance with the present invention that in the manufacture of semiconductor devices phase shift masks are advantageously employed but suffer drawbacks with regard to their repair. The phase shift masks possess clear regions that shift the phase of the transmitted (or reflected) light relative to the light transmitted by other regions of the mask, resulting in finer resolution, better dimensional control, and better yield of features in the semiconductor device being manufactured. The solution of the present invention involves the creation of a second mask that operatively cooperates with the phase shift mask by using phase shifters on the second or phase shift repair mask. Both masks are exposed onto the same wafer being manufactured using a double exposure technique (a first exposure using a first mask followed by a second exposure using a second mask).

The repair method of the present invention involves identifying and mapping the defective region of a first phase shift mask, making it opaque, then making a phase shift repair mask that is used to expose the area covered by the opaque region and providing the desired circuit patterns in the developed photoresist. The second mask operatively cooperates with the first mask. That is, neither mask by itself will produce the desired pattern in developed photoresist, but their use together does.

The present invention further includes combining phase shifter defect repair with the functions of a "trim" mask to solve the problem of the repair of defects on phase shifting areas of phase shifting masks and to provide trimming of extra images in one exposure. The second mask is called a trim mask because it removes unwanted features that exist in order to allow the first mask to work. Therefore, in cases where a trim mask exposure is required an advantage of the present invention is that by combining the phase defect repair and trim functions into the phase shift repair mask no time is added to the photolithography process by using a second exposure.

The present invention further includes combining phase shifter defect repair with any mask other than the defective phase shift mask for any processes that require multiple exposures of the same layer of resist where at least one mask is a phase shift mask. The phase shift repair mask can either be made of a new mask after determining the location of the defects in the phase shift mask to be repaired, or a mask that already exists in the process can be modified to include the repair phase shift features. In the first case, the phase shift repair mask is made by the standard phase shift mask manufacturing process. In the second case, additional processing of the existing mask is used to create the repair features in the existing mask. This is accomplished typically by performing additional patterning steps analogous to those used to create virgin phase shift masks, but where existing patterned areas not being modified are protected from processing, for example, by a layer of photoresist.

It has been discovered in accordance with the present invention that the order of mask exposure is unimportant. The phase shift mask or the phase shift repair mask could be exposed first. Masks are described herein as "first" or "second" solely for convenience in describing the art. No particular exposure order is necessary or implied in practice.

It has been discovered in accordance with the present invention that in some cases, particularly where the entire circuit pattern is much smaller than the field size of the exposure tool, a multiple exposure can be done using different areas or sections of the same mask as though they were different masks. The solution of the present invention would apply to this case as well, where the mask area used for the first exposure is considered the "first mask" and the mask area for the second exposure is considered the "second mask" etc. The same mask could have a phase shift mask section, a phase shift repair mask section, and a trim mask section.

It has been discovered in accordance with the present invention that it is extremely difficult to repair a phase shift mask and maintain the desired phase relationships between different regions because defects come in irregular shapes that make it impossible to deposit or remove material to give uniform phase shift in a region. The present invention sidesteps this difficulty by placing the repair on a repair mask, so that a uniform substrate is provided without preexisting phase regions. This is a much easier method than with the currently available technology.

It is therefore an advantage of the present invention to provide a low cost repair method.

It is a further advantage of the present invention to provide a clear resolution of the circuit design on the wafer and a good process window for the repaired feature.

DESCRIPTION OF THE PREFERRED EMBODIMENTS

In this description, the terms "electromagnetic radiation" and "imaging radiation" are intended to cover all radiation which is transmitted via photons or electrons, including, but not limited to, visible, infrared, and ultra-violet radiation.

Figure 1:
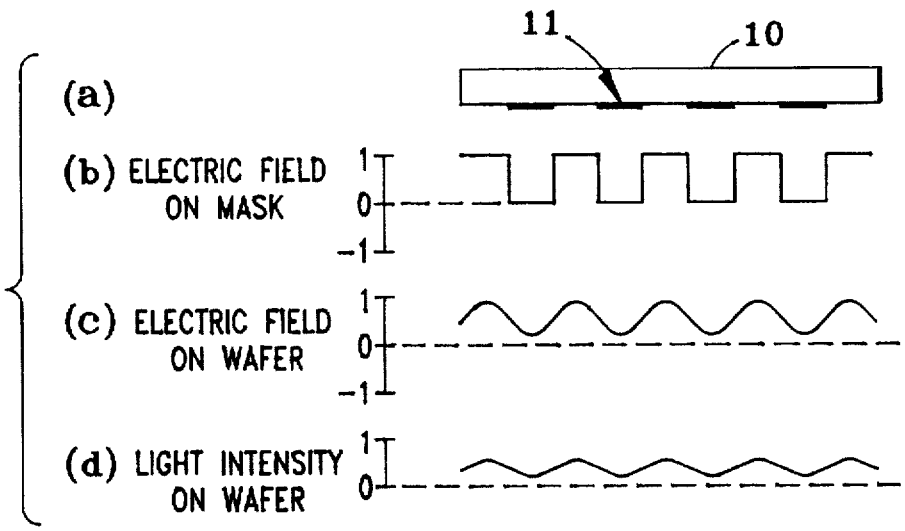
FIG. 1(a) is a cross-sectional view of a conventional mask.
FIG. 1(b) is a graph showing an electrical field on the mask when the conventional mask is used.
FIG. 1(c) is a graph showing an electrical field on the wafer when the conventional mask is used.
FIG. 1(d) is a graph showing light intensity on the wafer when the conventional mask is used.
Figure 2:
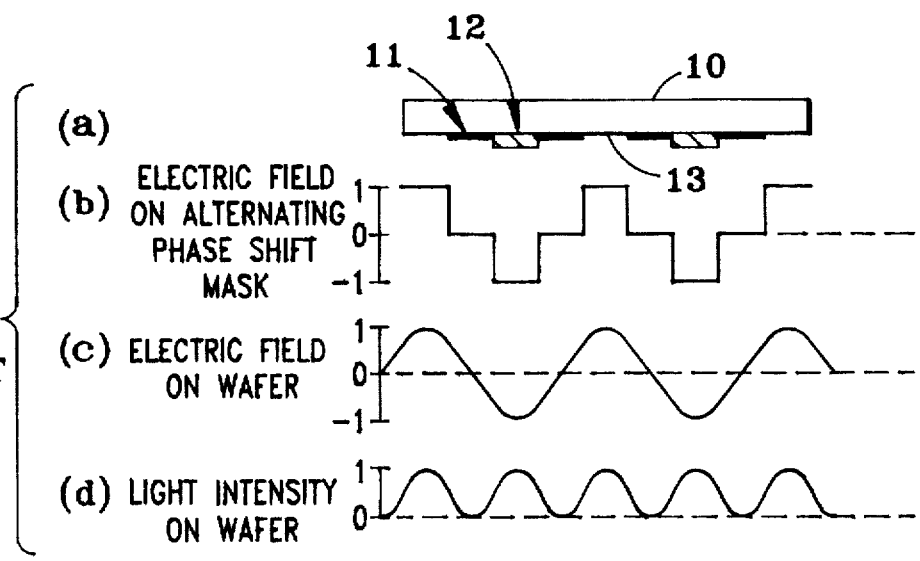
FIG. 2(a) is a cross sectional view of a phase shift mask of the alternating phase shift type.
FIG. 2(b) is a graph showing an electrical field on the mask when the alternating phase shift type is used.
FIG. 2(c) is a graph showing an electrical field on the wafer when the alternating phase shift type mask is used.
FIG. 2(d) is a graph showing light intensity on the wafer when the alternating phase shift type mask is used.
Figure 3:
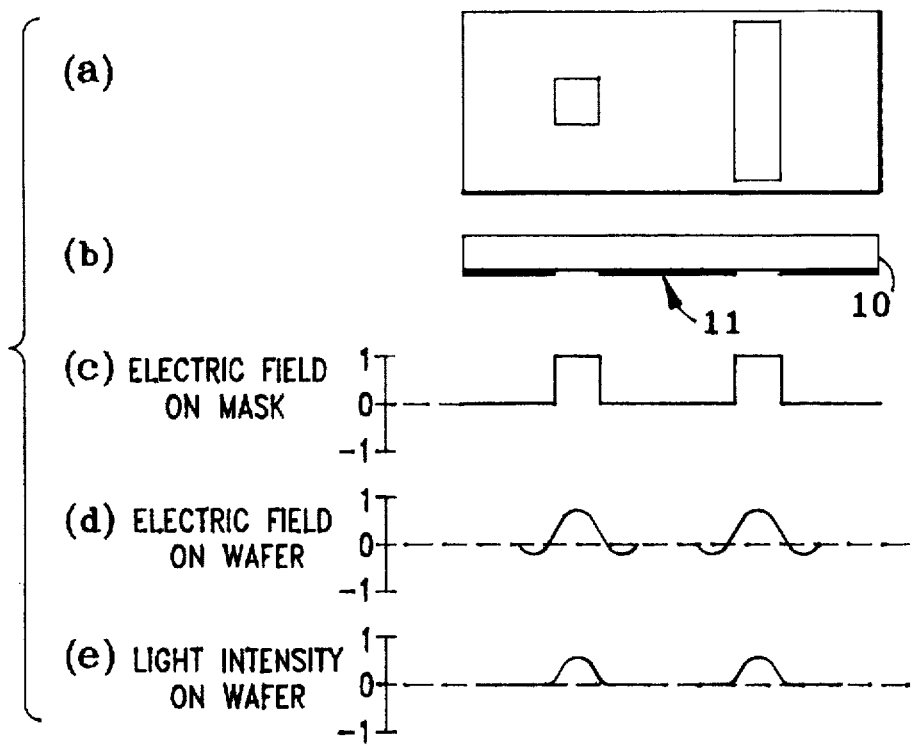
FIG. 3(a) is a top view of a conventional mask.
FIG. 3(b) is a cross-sectional view of a conventional mask.
FIG. 3(c) is a graph showing an electrical field on the mask.
FIG. 3(d) is a graph showing an electrical field on the wafer.
FIG. 3(e) is a graph showing light intensity on the wafer.
Figure 4:
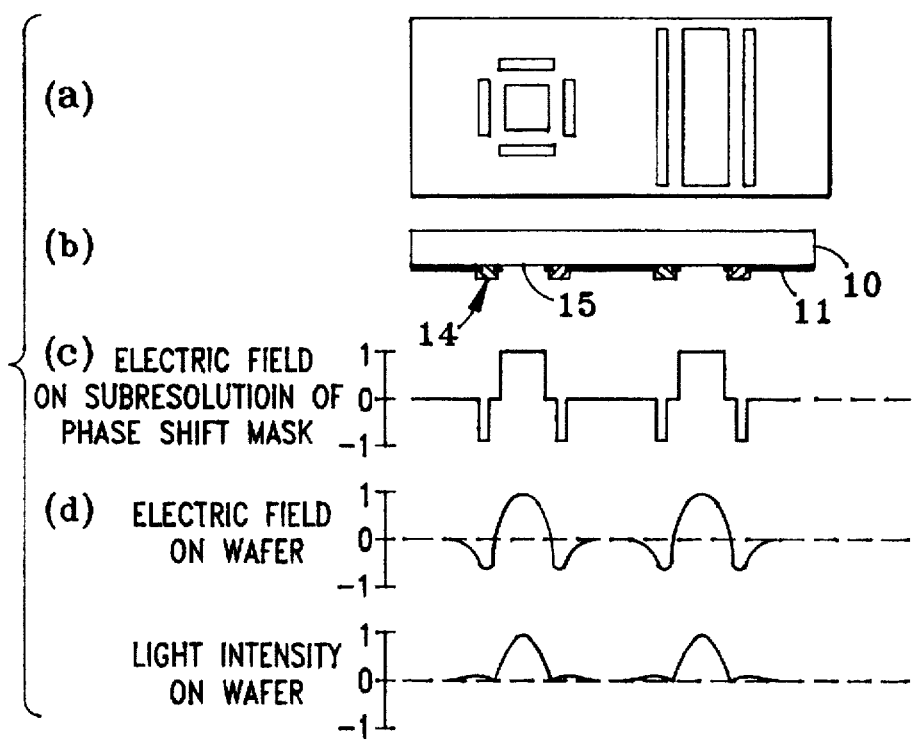
FIG. 4(a) is a top view of a subresolution phase shifting mask.
FIG. 4(b) is a cross-sectional view of a subresolution phase shifting mask.
FIG. 4(c) is a graph showing an electrical field on the mask when the subresolution phase shifting mask is used.
FIG. 4(d) is a graph showing an electrical field on the wafer when the subresolution phase shifting mask is used.
FIG. 4(e) is a graph showing light intensity on the wafer when the subresolution phase shifting mask is used.
Figure 5:
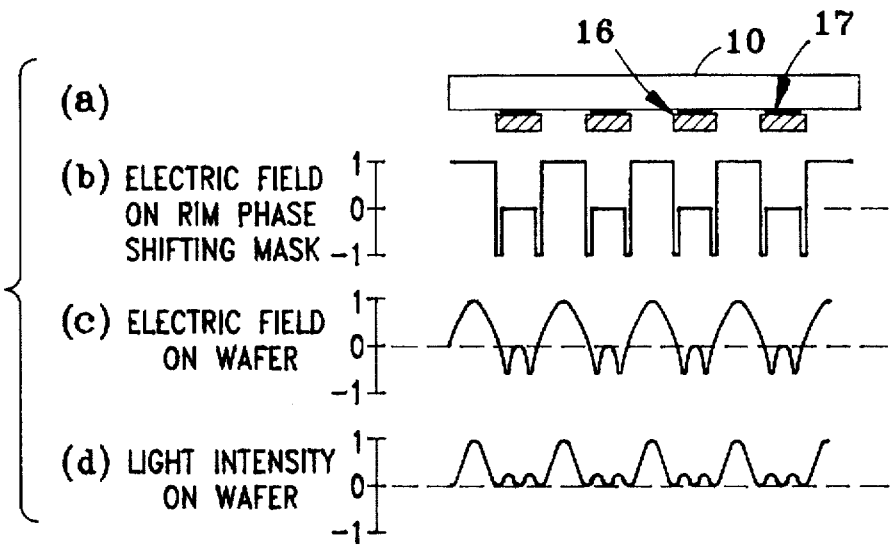
FIG. 5(a) is a cross-sectional view of a rim phase shifting mask.
FIG. 5(b) is a graph showing an electrical field on the mask when the rim phase shifting mask is used.
FIG. 5(c) is a graph showing an electrical field on the wafer when the rim phase shifting mask is used.
FIG. 5(d) is a graph showing light intensity on the wafer when the rim phase shifting mask is used.
Figure 6:
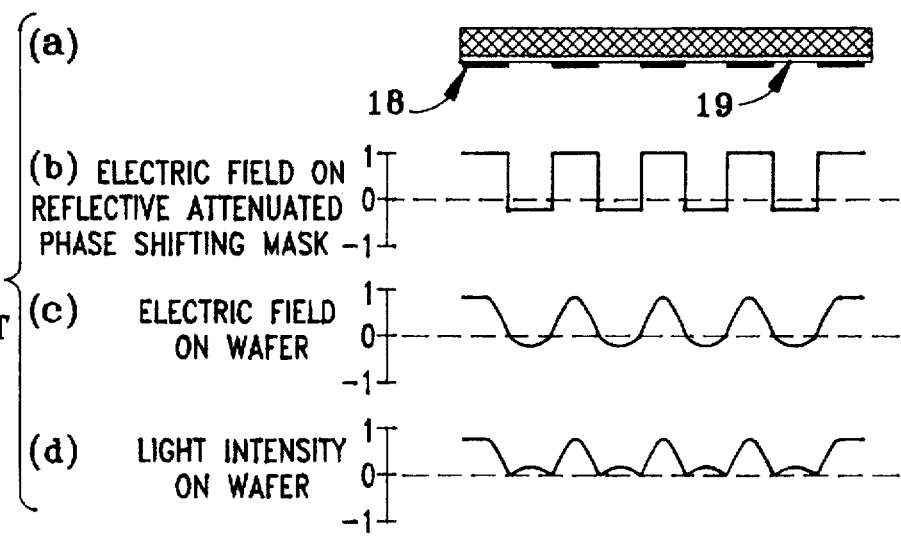
FIG. 6(a) is a cross-section of an attenuated phase shifting mask.
FIG. 6(b) is a graph showing an electrical field on the mask when the attenuated phase shifting mask is used.
FIG. 6(c) is a graph showing an electrical field on the wafer when the attenuated phase shifting mask is used.
FIG. 6(d) is a graph showing light intensity on the wafer when the attenuated phase shifting mask is used.
Figure 7:
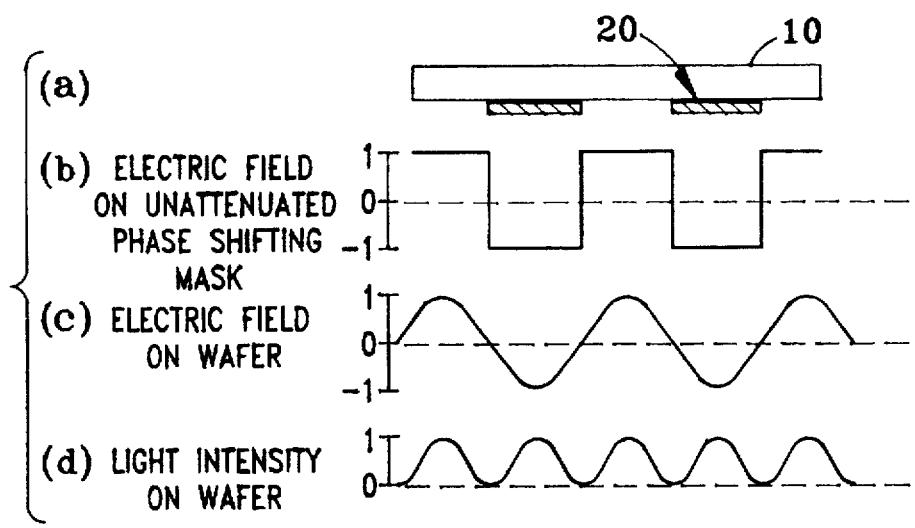
FIG. 7(a) is a cross-section of an unattenuated mask.
FIG. 7(b) is a graph showing an electrical field on the unattenuated mask.
FIG. 7(c) is a graph showing an electrical field on the wafer when the unattenuated mask is used.
FIG. 7(d) is a graph showing light intensity on the wafer when the unattenuated mask is used.
Figure 8:
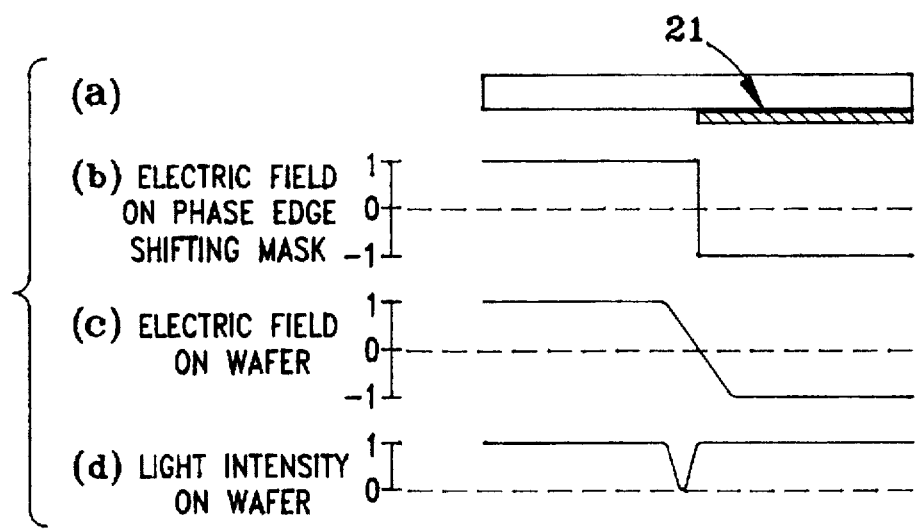
FIG. 8(a) is a cross-sectional view of a phase edge shifting mask.
FIG. 8(b) is a graph showing an electrical field on a phase edge shifting mask.
FIG. 8(c) is a graph showing an electrical field on a wafer when the phase edge shifting mask is used.
FIG. 8(d) is a graph showing light intensity on the wafer when the phase edge shifting mask is used.
Figure 9:
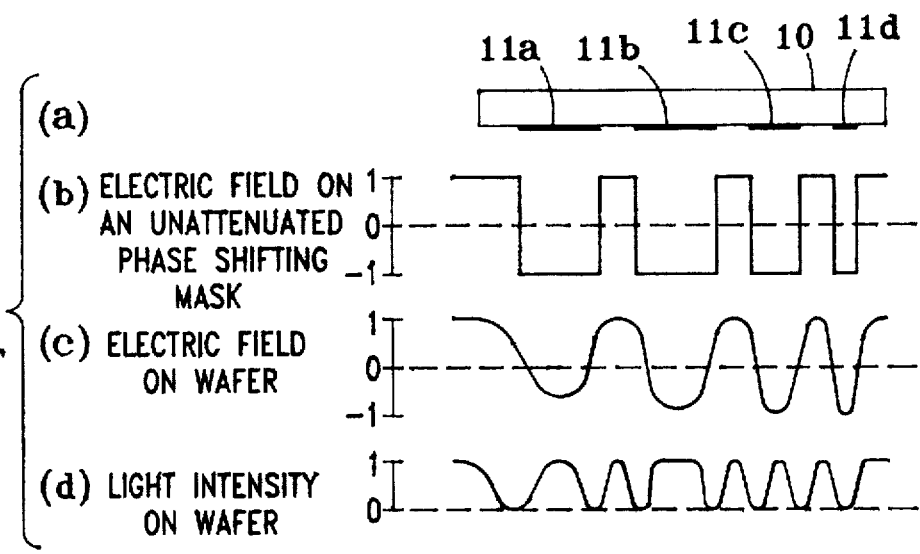
FIG. 9(a) is a cross-sectional view of a unattenuated phase shifting mask.
FIG. 9(b) is a graph showing an electrical field on the conventional mask.
FIG. 9(c) is a graph showing an electrical field on a wafer.
FIG. 9(d) is a graph showing light intensity on the wafer.
Figure 10:
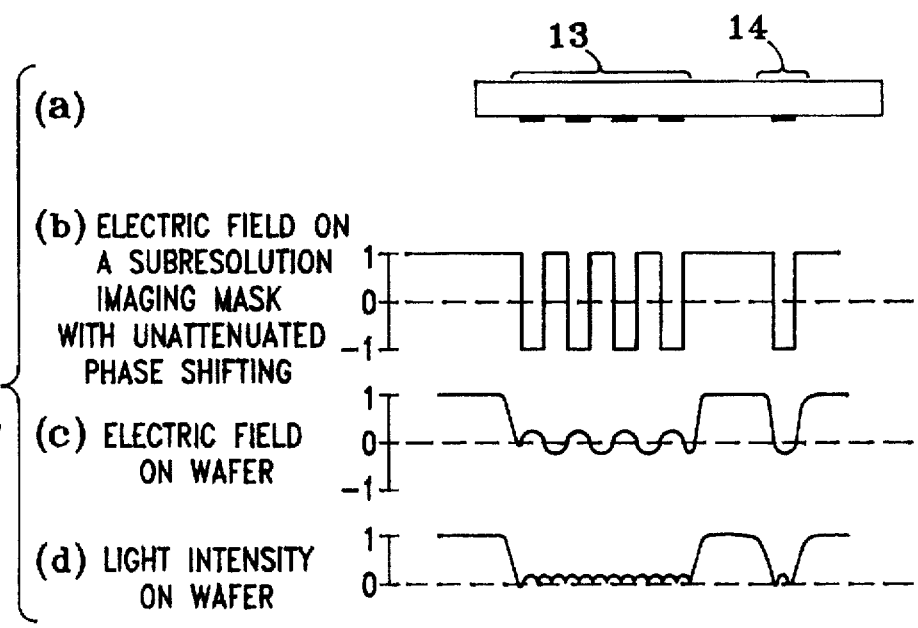
FIG. 10(a) is a cross-sectional view of a subresolution imagining mask with unattenuated phase shifting.
FIG. 10(b) is a graph showing an electrical field on the mask.
FIG. 10(c) is a graph showing an electrical field on a wafer.
FIG. 10(d) is a graph showing light intensity on the wafer.

The present invention is applicable to all known phase shift mask techniques. A phase shift mask can be considered to be any mask where different areas of the mask transmit light of different phases, regardless of the degree of attenuation, or the shape, size, or placement of features on the mask. Examples include rim phase shifting, chromeless phase shifting masks, alternating phase shifting masks, Levenson phase shifting masks, phase edge masks, attenuating phase shift masks, outrigger phase shift masks, and many other types that are known by several names. For example, the masks described in FIGS. 9(a) and 10(a) can be referred to as chromeless, shifter shutter, and phase edge. The present invention refers to phase shift masks in general, including, but not limited to combinations of the types listed above. The present invention is of value wherever control of phase of a mask repair is desired.

Figure 11:
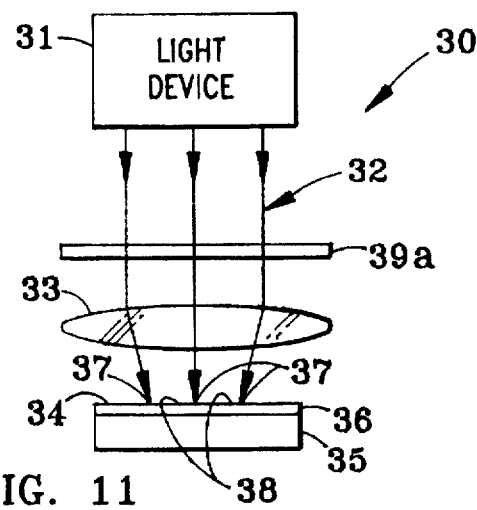
FIG. 11 is an exposure with the phase shift mask.

FIG. 11 illustrates a photolithographic device 30 for use with the present invention that includes a light source 31 which emits partially coherent electromagnetic radiation 32 (for example, ultraviolet light). This electromagnetic radiation 32 is applied to a phase shift mask 39a. The mask is configured to apply a desired pattern of electromagnetic radiation, via an appropriate optical system 33, to a surface 34 of a workpiece or wafer 35. Photolithography has been found to be an especially suitable technology when applied to the patterning of semiconductor devices so that it will be understood that this description will be in that context. In photoresist processes, the surface 34 is coated with a positive or negative photoresist 36. Suitable photoresists are known in the art, and will not be further detailed herein except as applicable to the present invention. The photoresist 36 is selectively patterned by the application of, or lack of application of, electromagnetic radiation.

The electromagnetic radiation strikes the surface 34 at a selected region called an electromagnetic radiation application region 37 (hereinafter referred to as "EAR"). EARs are defined as those regions of the surface 14 that have been exposed to sufficient electromagnetic radiation from the light source 31 to be affected by it. Any region on the surface which is not within an EAR is defined as an unaffected space 38.

Figure 12A:
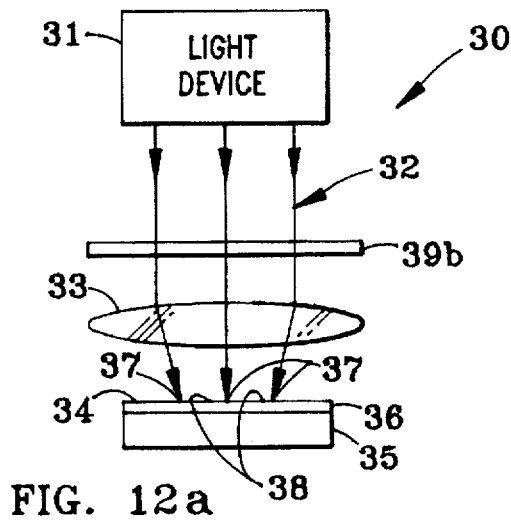
FIG. 12(a) is an exposure with the second mask, for example a phase shift repair mask which can also perform a trim function.

It has been discovered in accordance with the present invention that a phase mask "repair" can be completed by identifying a defect in the phase shift mask 39a, making the repair region around and including the defect opaque using traditional mask repair technology, and then creating a new feature in the corresponding area of the phase shift repair mask 39b that prints the desired feature or circuit pattern on the wafer during a second exposure as shown in FIG. 12(a). It is expected that the yield of the phase features in the phase shift repair mask will be very high because, for any reasonable manufacturing process, the area of repair will be very small compared to the surface area of the original phase mask.

The invention utilizes a phase shift repair mask that is fabricated after the defects on the phase shift mask are mapped and characterized. Openings or repair areas are delineated at the locations corresponding to the phase defect sites on the phase shift mask. Missing chrome defects are repaired by conventional methods and the misplaced chrome can be repaired conventionally or by extra openings at the repair mask. By superpositioning the exposures from the phase shift mask and the phase shift repair mask, the extra dark lines caused by the phase shifter defects on the phase shift mask are cleaned up. The positioning accuracy can be in the order of 50 nm which is comparable, if not better, than that of either focused or ion beam or laser repair. When there are no defects near edges, a high superpositioning accuracy is not required. This works with either positive or negative resists.

The solution described here takes advantage of the fact that certain phase shift mask designs (i.e., phase edge and alternating) already require a second mask, called a trim mask. Both the phase shift and trim masks are exposed onto the same wafer using a double exposure. The phase shift mask creates the features of minimum critical dimensions in the resist, and leaves unwanted unexposed lines in the resist because of extra phase edges required by the phase mask design. The trim mask is used to remove these unwanted features. Even when success is achieved in laying out an efficient circuit design, unwanted phase boundaries still occur in the mask; that is, boundaries between a 0 and 180 degree phase, where no feature is desired. Without a second "trim" mask these boundaries will print as lines. The first mask prints regions that are critical to performance of the devices and the second mask "trims" the latent image in the photoresist by exposing unwanted lines left by the first exposure. If, for some design reason, the trim and repair masks cannot be combined, a three mask process can be used, where one mask is the phase shift mask, one is the repair phase shift mask, and one is the trim mask. In such a case three exposures of the same resist film would be used.

In practice, one would probably identify the defects in the phase shift mask before building the phase shift repair mask, and then modify the phase shift repair mask design to include the defect correction and trim features. However, if the trim mask was already built, the repair feature could be created in the trim mask with a repair process that used existing mask build tooling. Also, if a phase shift mask with a second design was already built or in the process of being built, the repair feature could also be created on this mask.

Figure 13A:
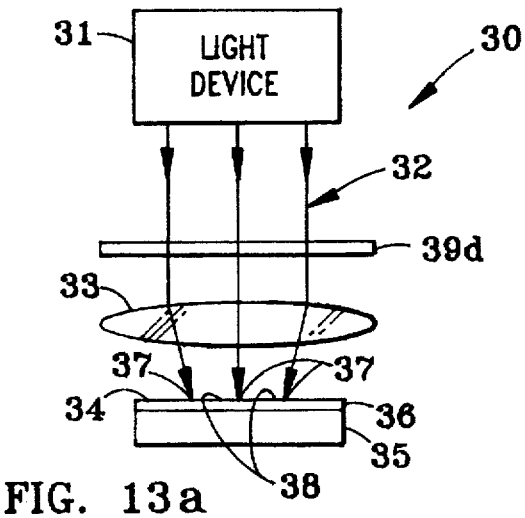
FIG. 13(a) is an example of an exposure in the case where a phase shift mask section and phase shift repair mask section are located on one mask.
Figure 13B:
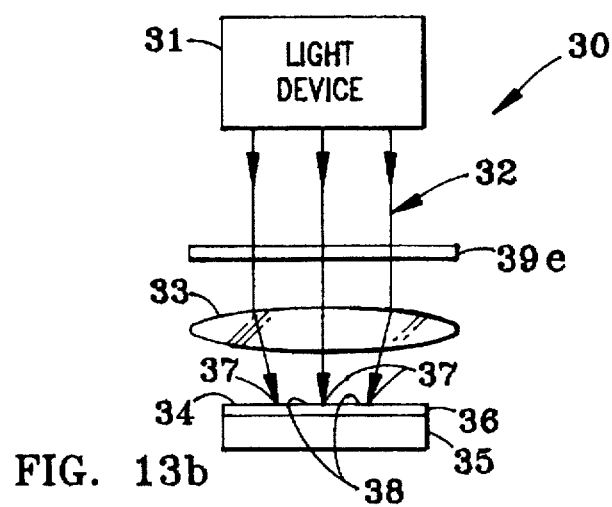
FIG. 13(b) is an example of an exposure in the case where a phase shift mask section, phase shift repair mask section, and trim mask section are all located on one mask.

Also, in practice the phase shift mask and the phase shift repair mask could be located on separate sections of the same mask and the two exposures could be done with the same mask (39d in FIG. 13(a)). Also, the phase shift mask, the phase shift repair mask, and the trim mask could all be located on different sections of the same mask and the three exposures could be done with the same mask in any order (39e in FIG. 13(b)).

The following example describes the repair of an alternating or "Levinson" type phase shift mask. It should be noted that in accordance with the present invention repairs of other types of phase shift masks can be done analogously. Examples of other types of phase shift masks that could be repaired in this manner include attenuated, unattenuated, subresolution, rim, and phase edge masks. However, the invention is not limited to these examples and could be used on any mask which uses phase shifting.

Figure 14:
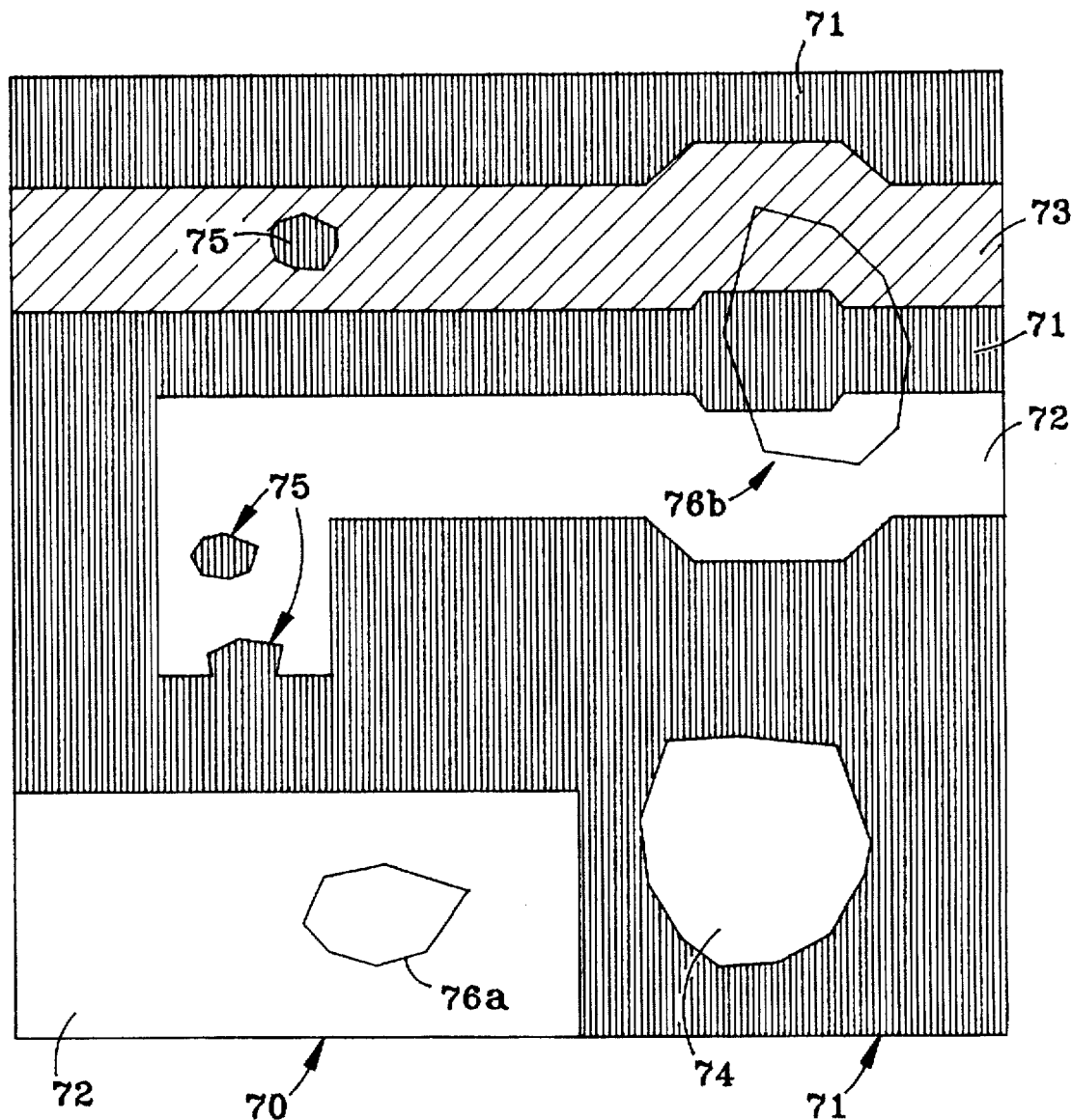
FIG. 14 is a phase shift mask with defects in the phase shifting part and the chrome on glass portion.

An example of a region of a typical alternating phase shift mask containing defects before repair is shown in FIG. 14. FIG. 14 shows a quartz mask 70 with chrome opaque regions 71, clear regions 72, and phase shifting regions 73. The quartz mask 70 has missing chrome defects 74, misplaced chrome defects 75, and redundant or missing material defects (i.e., 76a and 76b). If mask 70 was defect free, when used with positive photoresist it would print openings in the resist corresponding to areas 72 and 73. The opaque region between the phase shifted region 73 and the adjacent clear region 72 will print as a line in resist with enhanced resolution and/or process control because of the difference in phase on either side of the opaque region in this part of the mask. When there is no defect, the two openings are 180 degrees phase shifted to improve the image contrast between them. A phase shifting mask defect can change the phase shifting angle to more or less than the optimum, thus reducing the imaging contrast.

Figure 15:
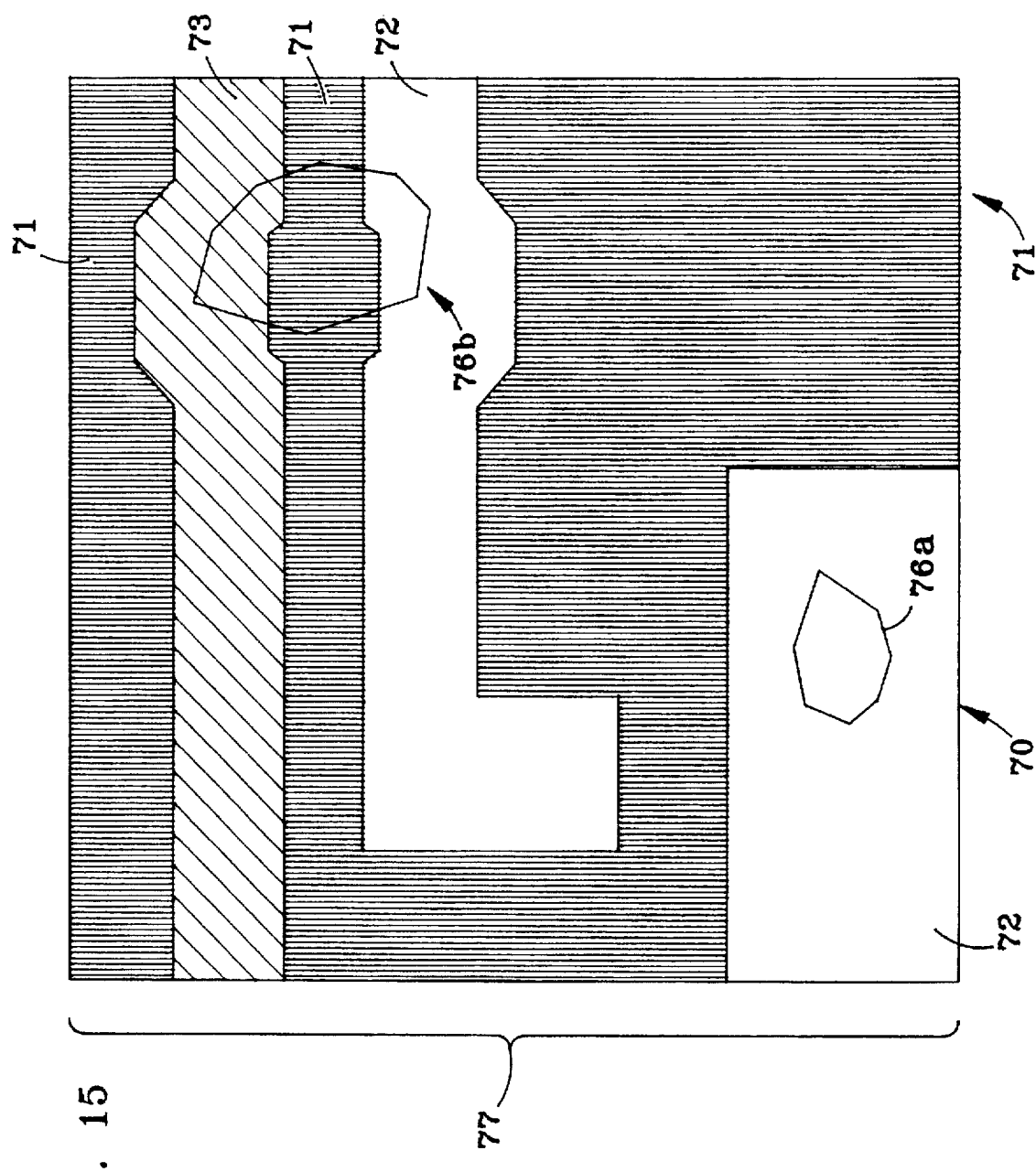
FIG. 15 is a phase shift mask with defects in the phase shift part and with the defects in the chrome on glass portion repaired.

Examples of phase shifting mask defects include inducing extra dark lines at the edges of the defect (e.g., 76a) or reducing the image contrast and thus reduce dimensional control of the printed image (e.g., 76b). The traditional repair methods for conventional masks (masks without phase shifting) such as ion beam repair could be made on the phase shift mask of FIG. 14 to produce the mask region 77 as shown in FIG. 15. Note that only the misplaced chrome 75 and missing chrome defects 74 could be repaired on the phase shift mask using binary mask repair methods (i.e., for example, ion beam to remove misplaced chrome and addition of chrome to cure missing chrome defects). However, the defects such as 76a and 76b in the phase shifting regions still remain.

Figure 16:
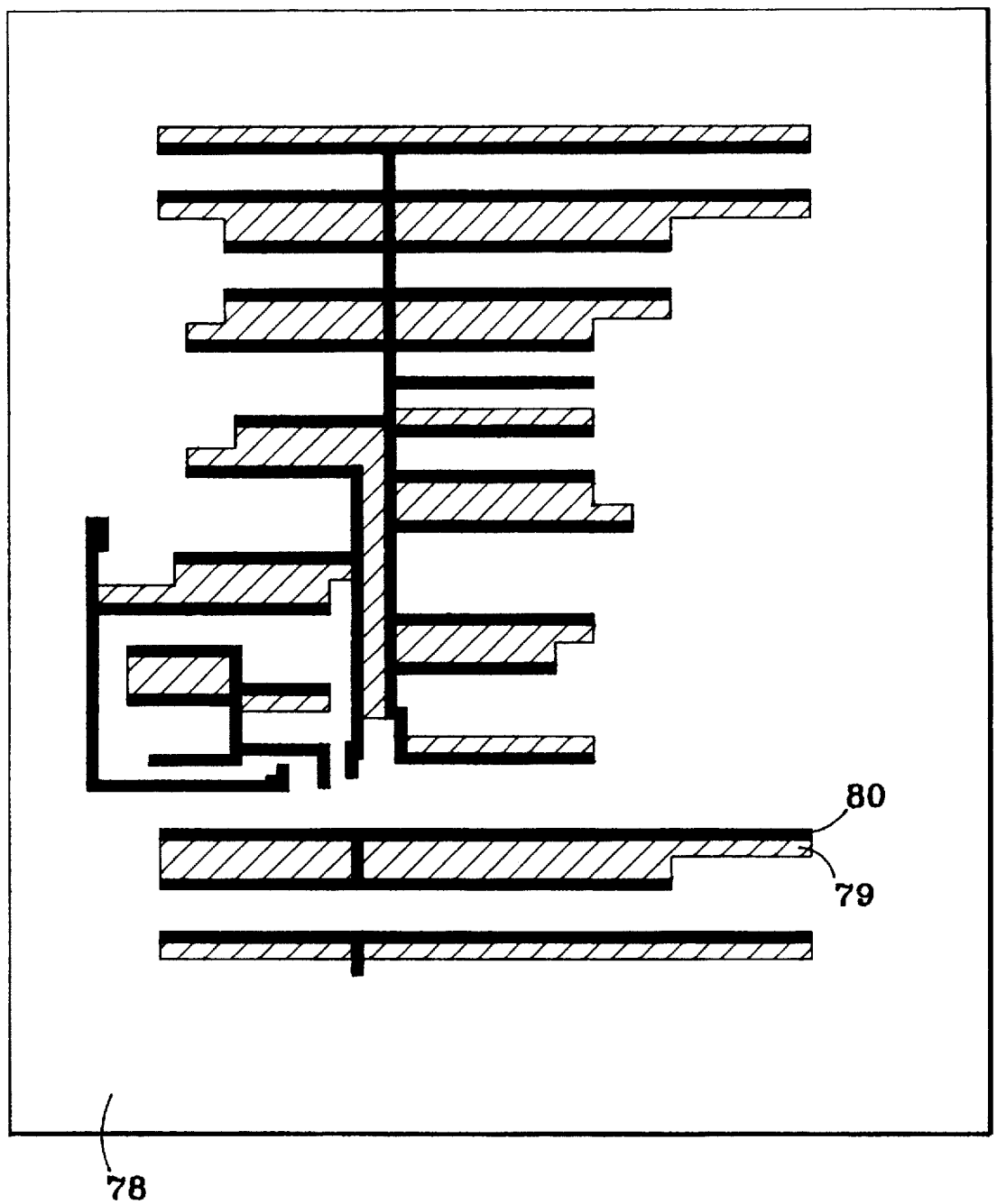
FIG. 16 is a phase shift mask using an alternating phase shifting mask.
Figure 17:
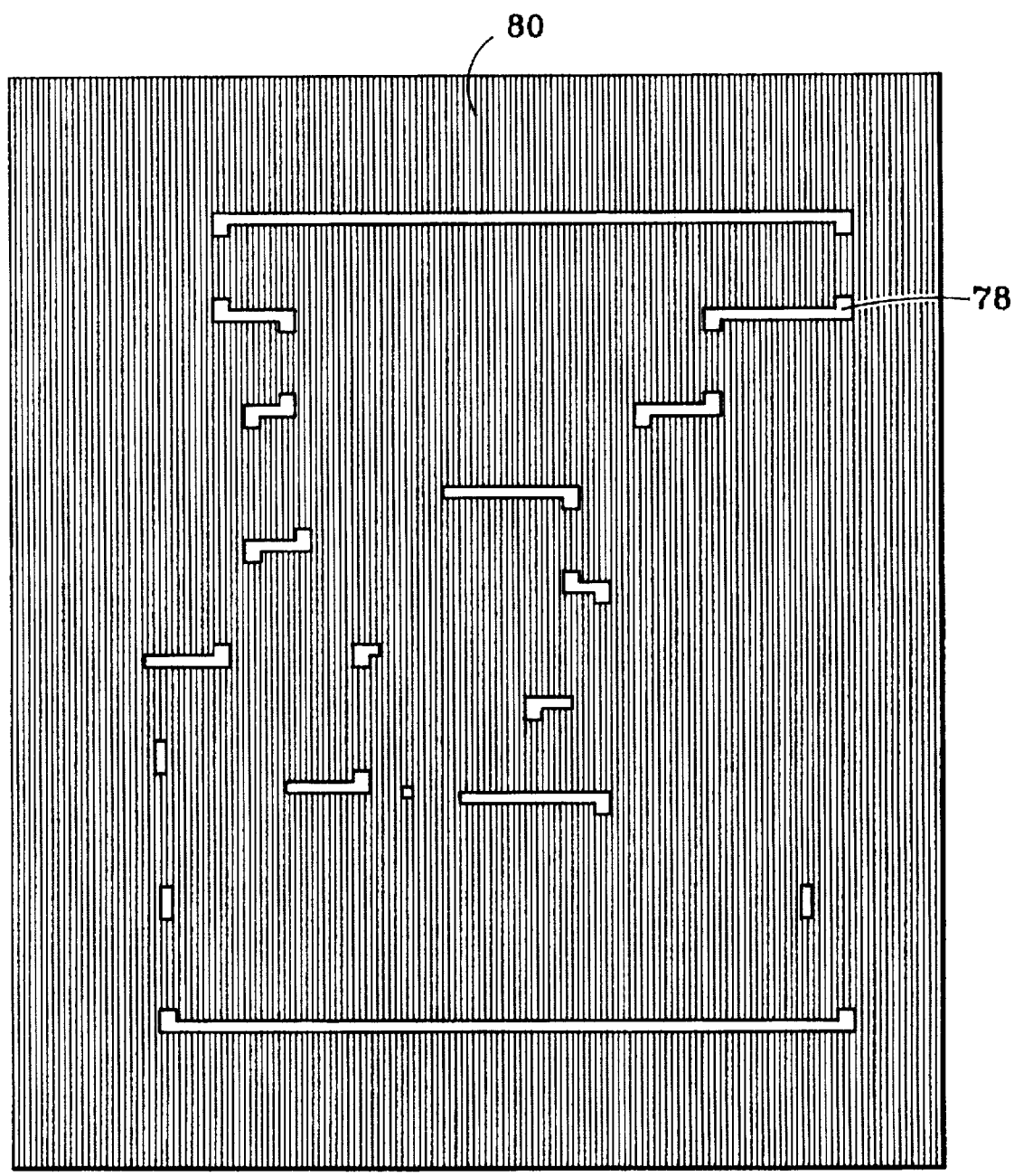
FIG. 17 is a trim mask for the mask shown in FIG. 16.
Figure 18:
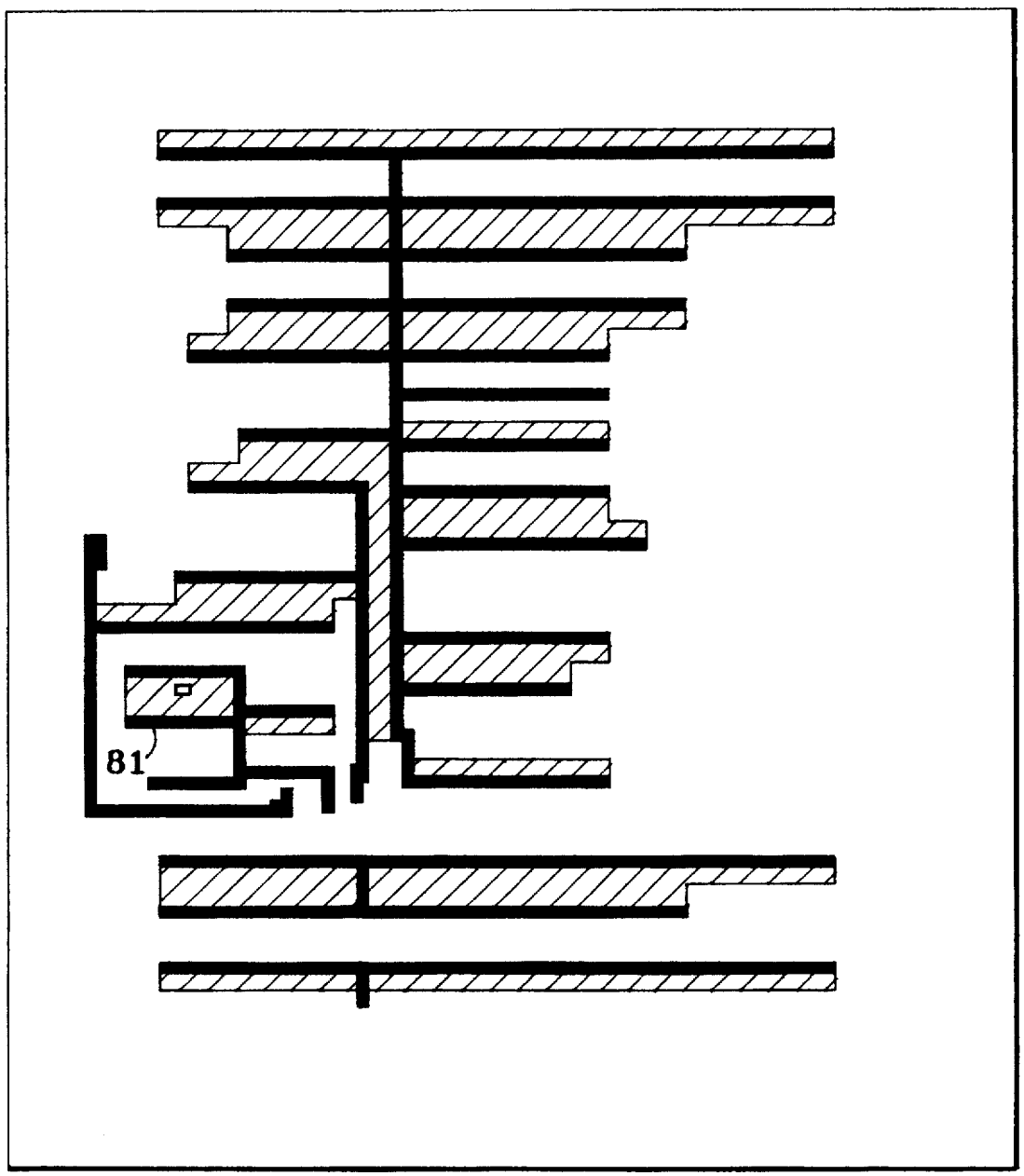
FIG. 18 is a phase shift mask with a phase defect.
Figure 19:
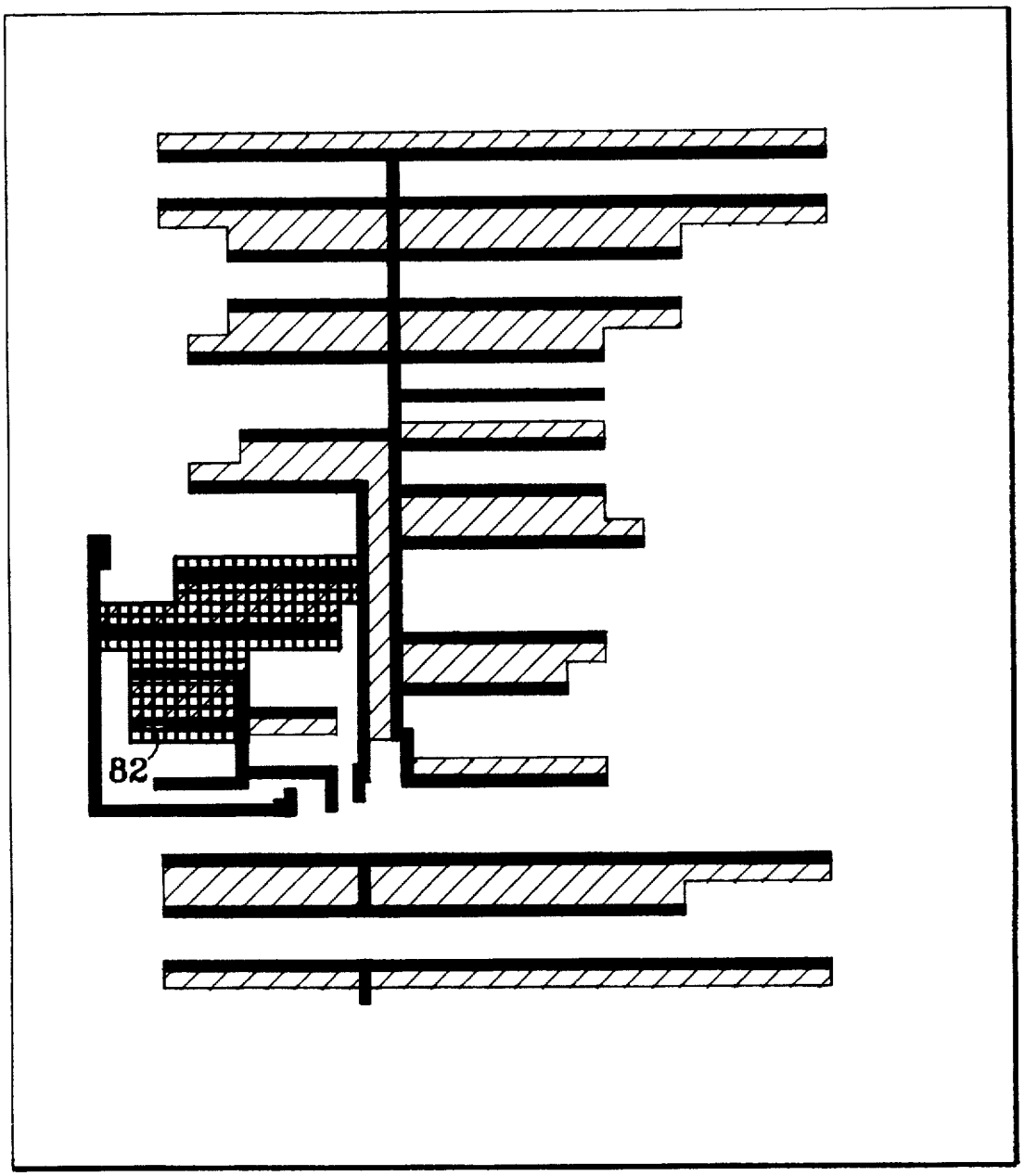
FIG. 19 is a phase shifting mask with a phase defect and a critical region defined around the defect.
Figure 20:
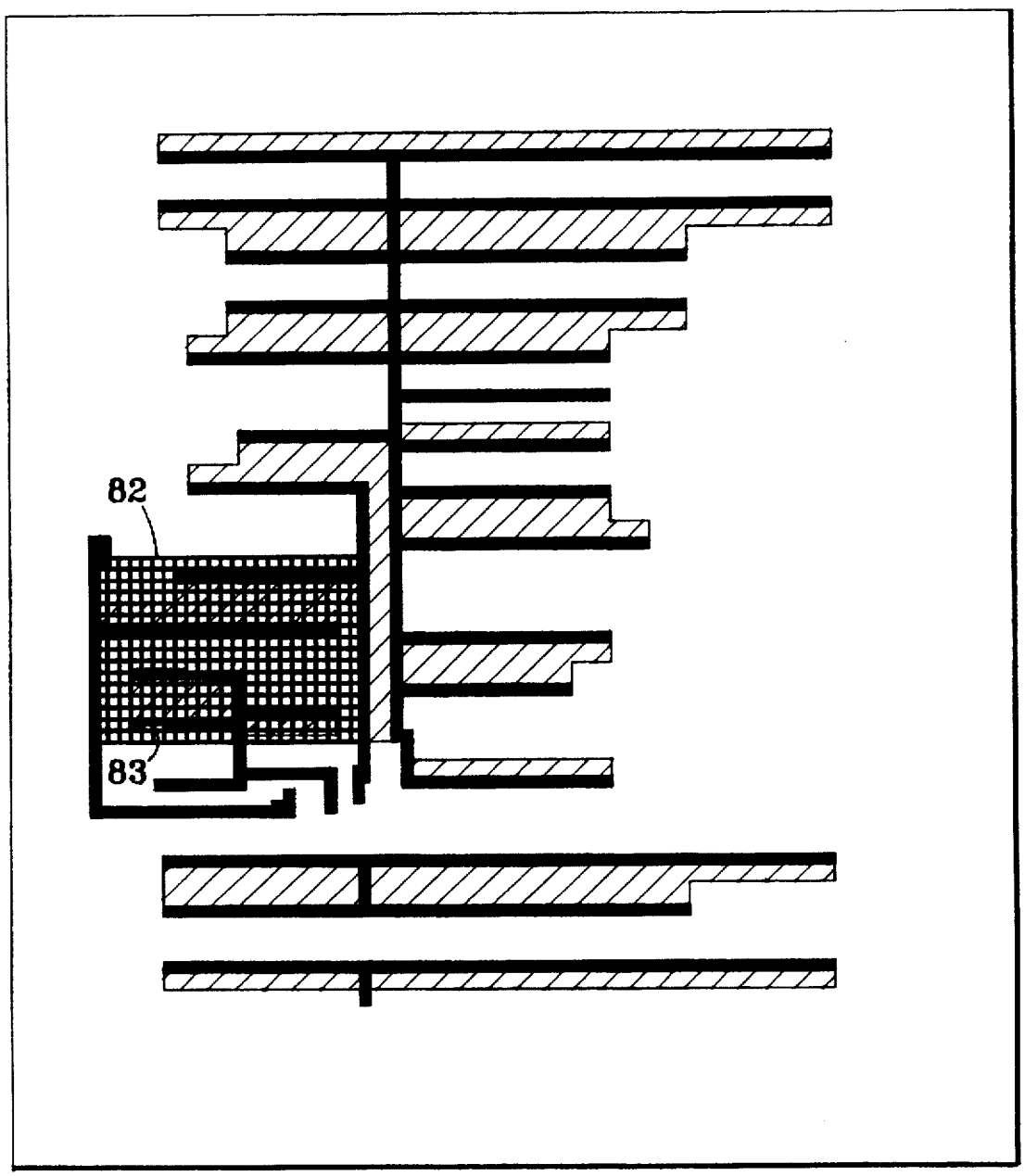
FIG. 20 is a phase shifting mask with a rectangle enclosing the smallest repair region around a phase defect and the critical region defined around the defect.
Figure 21:
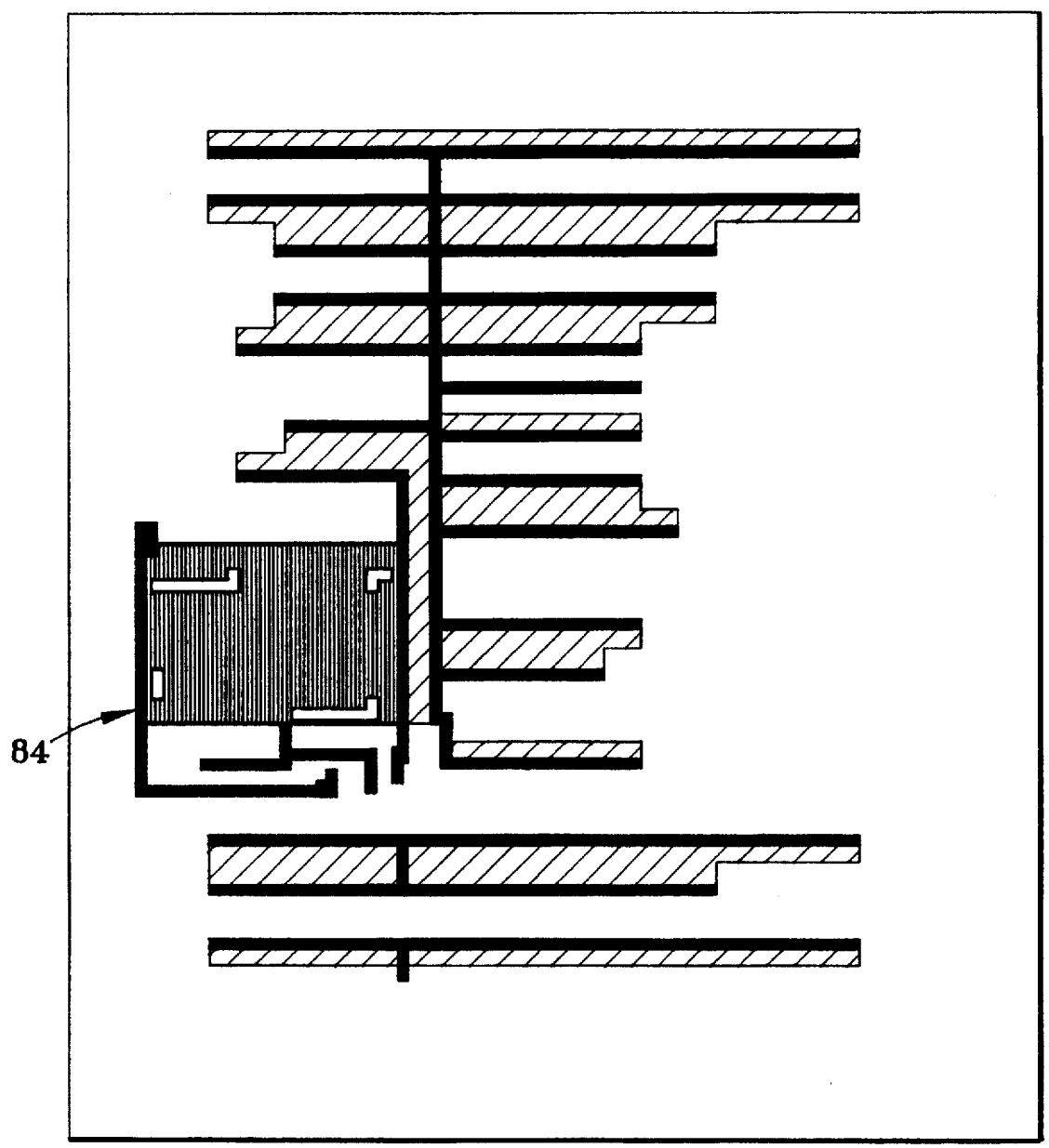
FIG. 21 is a phase shift mask with the defective region made opaque.
Figure 22:
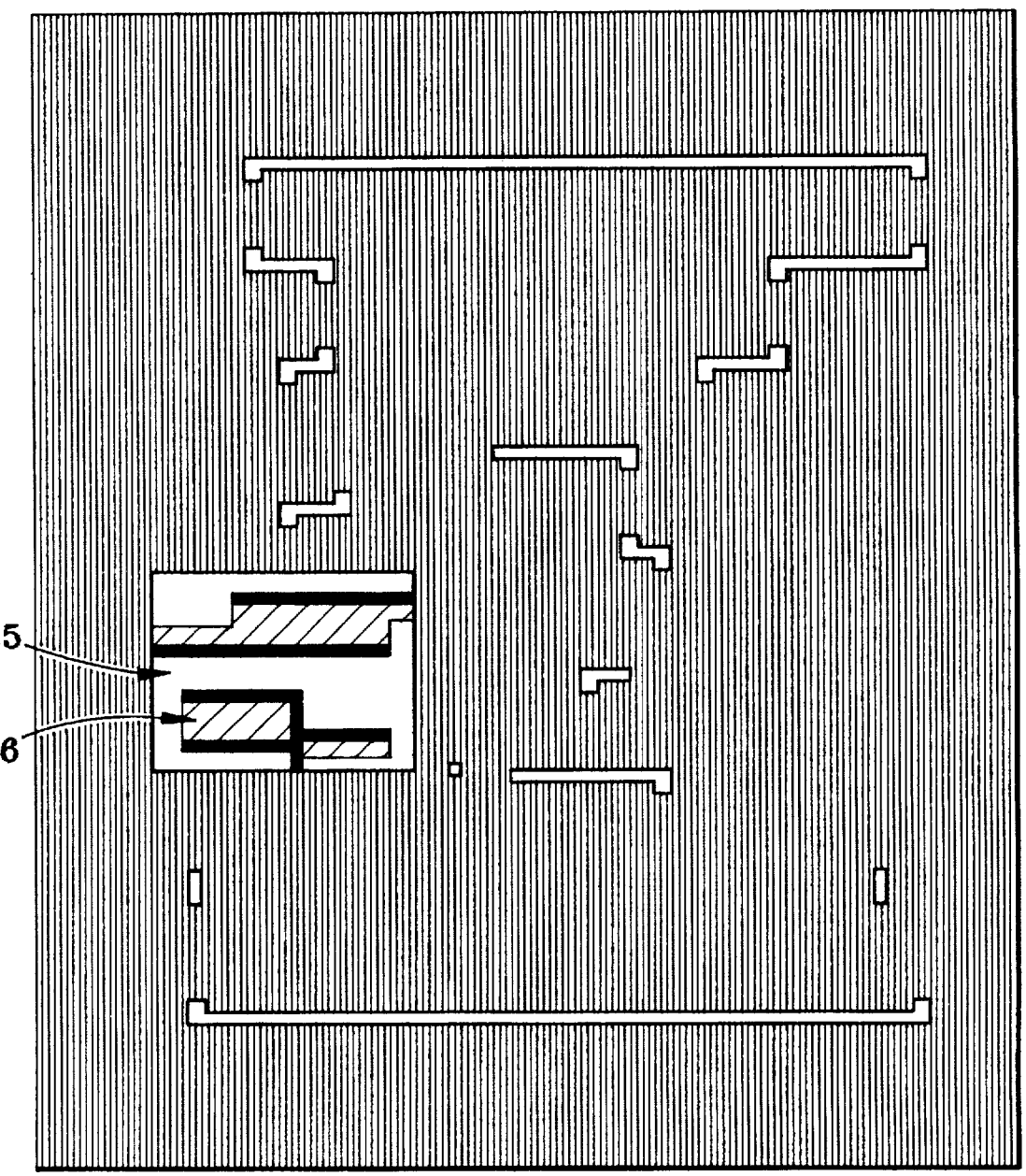
FIG. 22 is a phase shift repair mask which combines phase shift repair with the trim feature.

The phase shift defects may then be repaired using the technique described herein. FIG. 16 shows a phase shift mask pattern with no defects where the clear area 78 transmits light of 0 degree phase, the cross-hatched areas 79 transmit light of 180 degrees phase, and the opaque areas 80 do not transmit light. FIG. 17 shows an accompanying conventional trim mask with clear areas 78 and opaque areas 80. FIG. 18 shows the phase shift mask of FIG. 16 with a phase defect 81. FIG. 19 shows the phase shift mask of FIG. 18 with a repair 82 defined that is off limits to any repair boundary due to critical line width control or overlay requirements. FIG. 20 shows the phase shift mask of FIG. 19 with a rectangular repair region 83 defined that encloses area 82 and whose boundaries fall in non-critical areas. Then by using standard repair techniques for making clear areas opaque, one can repair the phase shift mask shown in FIG. 18 by making region 84 opaque to achieve the repaired phase shift mask shown in FIG. 21. A combined repair and trim mask as shown in FIG. 22 is then created to form the phase shift repair mask either by modifying the trim mask shown in FIG. 17 by using a standard technique for making opaque areas clear to create clear region 85, followed by a standard technique for creating phase shift regions 86, or by making the mask shown in FIG. 22 from scratch, in the same manner the original phase shift mask shown in FIG. 16 was created. Now successive exposures of the repaired masks shown in FIGS. 21 and 22 will create the same image in photoresist that successive exposures of the original mask designs shown in FIGS. 16 and 17 would. Since repaired areas are typically a small portion of a masks areas, they are easy to make defect free. Therefore, the areas printed by the repaired masks will have the desired dimensional control and process latitude that the area printed by the original masks would have.

Figures 23, 24:
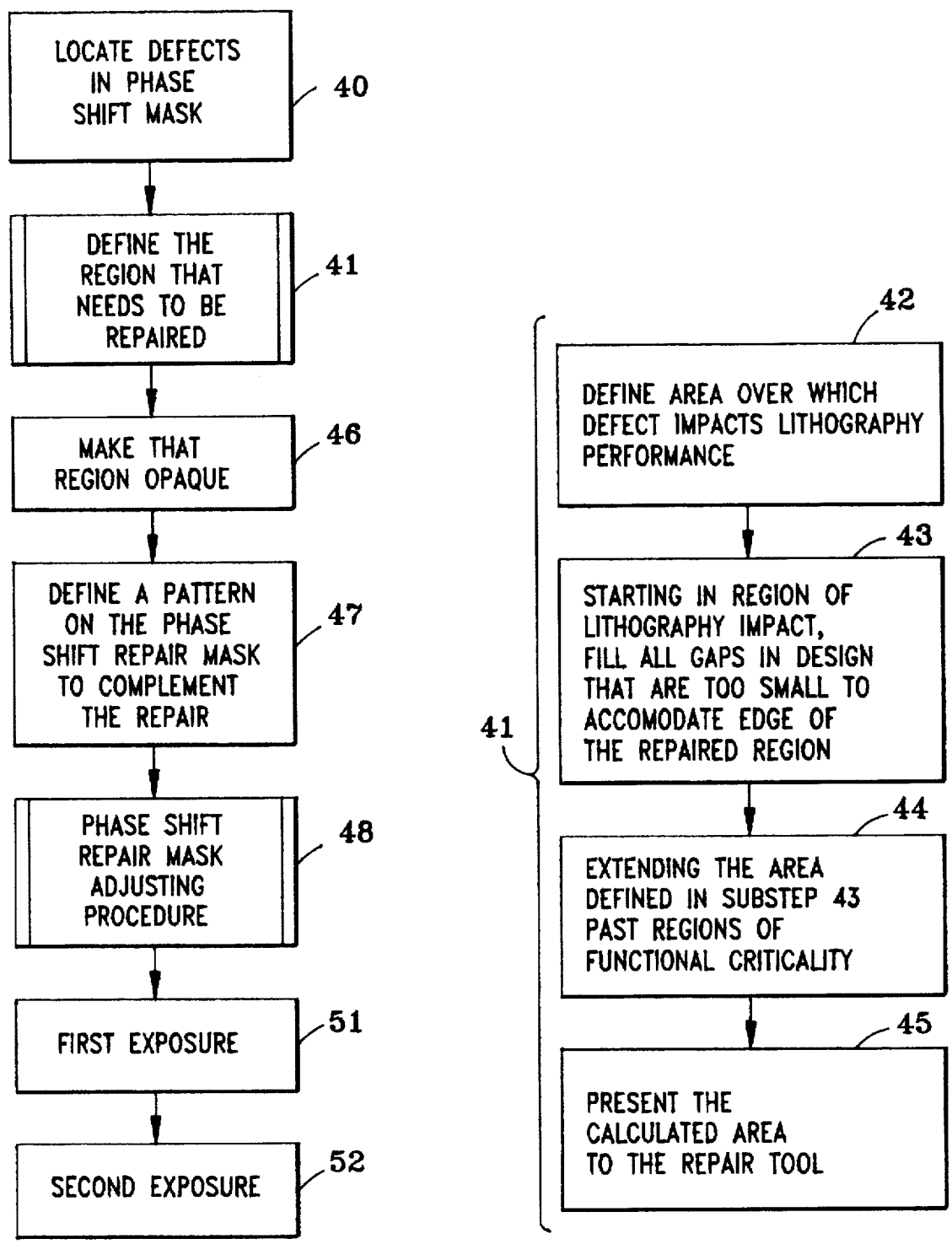
FIG. 23 is a flow diagram of the repair method of the present invention where two masks are used.
FIG. 24 is a flow diagram of a subroutine of the flow diagram of FIG. 23.

A flow chart describing this method for designing the repair into the trim mask is shown in FIG. 23. The first step 40 is to locate the defects in the phase shift mask. This can be accomplished by using existing inspection capability and then transferring the defect coordinates to the CAD/CAM system.

A second step 41 would be defining the region that needs to be repaired. FIG. 24 shows subroutine 41 in detail. Subroutine 41 would include the substep 42 of defining the area over which the defect impacts the lithography performance. An Aerial Imagining Measurement Tool (AIMS) could be used as a way of measuring mask defects. AIMS is a way of characterizing the defect to see what effect it has on the aerial image. An AIMS machine includes means by which the operator can examine the mask with a microscope to obtain the quality of resolution of the printed lines. Another way to characterize defects in the mask would be to print masks and to inspect on wafers. These methods of defining defects are presented as examples and other methods of characterizing defects could be used.

The next substep 43 in the subroutine 41 would include starting in the region of lithography impact and filling all the gaps in the design that are too small to accommodate the edge of the repaired region. If the accuracy of the repair tool is much smaller than a minimum line width, there may be no such gaps. This gap width is determined by the resolution and placement accuracy of the mask repair tool and by the overlay tolerances between the two masks involved in the patterning process (e.g., a phase shift mask and phase shift repair mask). Filling these gaps can be accomplished using a CAD/CAM system to fill spaces of certain widths and makes defects opaque. An example of a CAD/CAM system that may be used is disclosed in U.S. Pat. No. 5,553,273 issued to Liebmann and assigned to International Business Machines Corporation and U.S. Pat. No. 5,553,274 issued to Liebmann and assigned to International Business Machines Corporation. The above references are hereby incorporated by reference.

The next substep 44 in subroutine 41 involves extending the area defined in substep 43 past regions of functional criticality (e.g., if the repaired mask is a gate level mask, the repaired region should terminate over isolation, not over active gate areas). A series of Boolean operations in the CAD/CAM system on the design level defining the critical functionality of a given mask level can be used to implement this operation. The operator should terminate the area by defining edges that run through a clear area of one phase wherever possible.

The final substep 45 in subroutine 41 is presenting the calculated repair area to the actual repair tool either in the form of a manual coordinate transfer (i.e., a list of coordinates on paper) or by an electronic coordinate transfer (i.e., convert to the coordinate system of the repair tool).

The next step 46 in FIG. 23 includes making the area opaque on the first phase shift mask. The next step 47 includes defining a pattern on the phase shift repair mask to complement the repair. Step 47 includes subtracting the designs on the first mask from the shape defining the repair area (e.g., if the repaired phase shifted mask is a gate level mask subtract the gate shapes from the polygon defining the repair zone). Then either use the same coloring routine as used in the original phase shift mask to assign 0 and 180 degree phases to the resulting shapes or intersect the shapes resulting from the subtraction with the phase shapes on the original phase shift mask to create alternate phase assignments.

Figure 25:
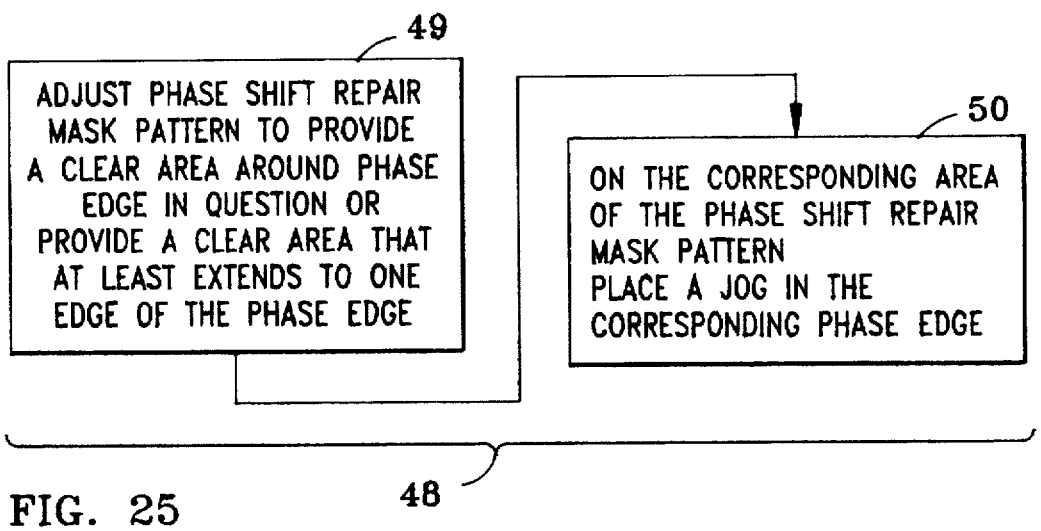
FIG. 25 is a flow diagram of a phase shift repair mask adjusting subroutine of the flow diagram of FIG. 23.

Subroutine 48 is an adjusting procedure which should enable repair to be done without a third trimming mask. Using a phase edge shifting mask as an example, in the area of concern there will be a new phase edge in the phase shift repair mask that one does not want to print and which is in the same place as a phase edge in the original design of the original phase shift mask. In the first substep 49 in FIG. 25, the operator adjusts the pattern on the phase shift repair mask to the original pattern on the phase shift mask so that there is a clear area around the phase edge in question, or so that the clear area at least extends to one edge of the phase edge. In the second substep 50 on the corresponding area of the pattern on the phase shift repair mask, the operator places a jog (a small step) in the corresponding phase edge so that wherever the edge does not define an opaque feature that is desired in the pattern, it is jogged sideways approximately half a critical dimension so that it superimposes with the clear area in the repaired phase mask. The width of the jog should be selected so that it is just large enough that overlay and repair tolerances will not place the phase edges over one another. Masks with phase edges having no chrome over the edge produce features small enough that even a small amount of double exposure will remove them. This procedure should work for all practical designs and allow the phase shift repair mask to not only repair the defects of the original phase shifting mask, but also to perform the functions of a trim mask.

Step 51 in FIG. 23 is an exposure of the first mask onto the wafer as shown in FIG. 11. This is followed by another exposure 52 using the phase shift repair mask as shown in FIG. 12(a).

Figure 12B:
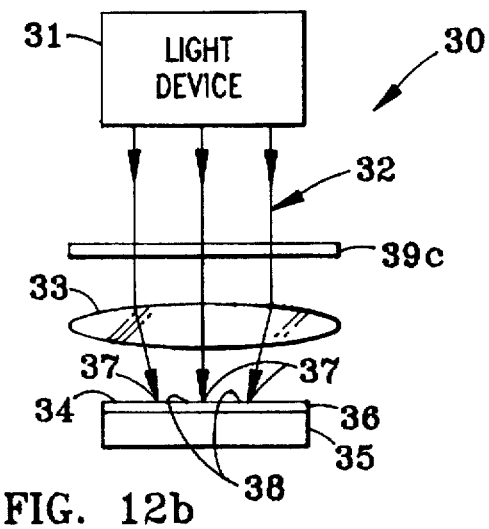
FIG. 12(b) is an exposure in the case where a third mask is required.
Figure 26:
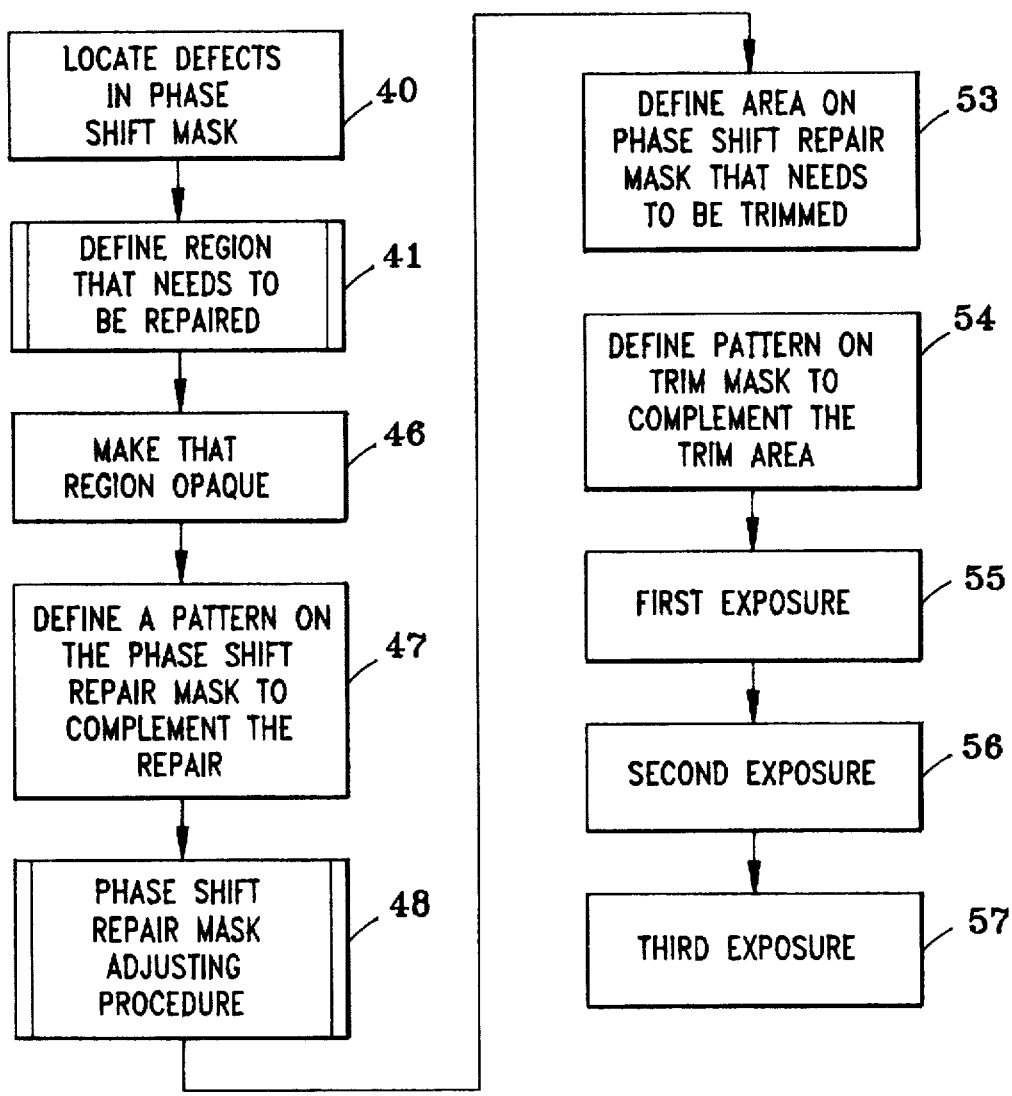
FIG. 26 is a flow diagram of the repair method of the present invention where three masks are used.

The repair method will work as long as the area of repair is not large enough to include enough features in a pattern such that it cannot be phase shifted without a trim mask. That is, this procedure should be applicable as long as the defects are smaller and/or sparser than the trim regions in the mask design in question. If this is not the case, a trim mask or third mask will have to be built, in order to trim the unwanted phase edges left by the new phase region in the phase shifting repair mask. The trim mask will be a binary mask and will trim off extraneous material in regions that are not critical. If a third mask is required, follow the steps disclosed in FIG. 26. Steps 40, 41, 46, 47, and 48 are the same as the two mask case. However, step 53 includes defining an area on the phase shift repair mask that needs to be trimmed. Step 54 defines a pattern on the trim mask to complement the trim area. Steps 55, 56, and 57 include exposure of the first mask, second mask, and third mask onto the wafer in sequence. FIGS. 11, 12(a), and 12(b) show the exposure of the first 39a, second 39b, and thirds 39c masks on the wafer. Note that each of the exposure steps can be followed by a development step or the development can be done at the end, depending on the photoresist's properties.

The use of two masks to put down critical features instead of one mask might be expected to provide an overlay concern. However, it has been discovered in accordance with the present invention that there are two reasons why this will usually not be the case. A first reason is that with modern exposure tools and processes most of the overlay error is driven by a grid error, not a mask alignment error. Most of the error comes from an inability to map perfectly the layer being aligned to. Mask alignment with the exposure tools is usually very repeatable. In a typical double exposure sequence used for phase edge masks, the wafer will be mapped once, and then each mask is aligned to the tool and stepped or stepped and scanned. Therefore, the alignment of each mask to each other will be much better than the typical specification for overlay of the pattern to the wafer. A second reason is that it is expected that particular critical features, for example, logic gates, will either be entirely on one mask or entirely on the other. Then each critical feature will align within specification to the layer below, since only one grid and one mask alignment error will be involved for that feature. In many cases, for example in designs with wide pitch, such as logic gate designs, this will ensure that the design works. However, there are some designs where the space between two adjacent features on the same mask is important. An example includes the case where a self aligned contact fits between two minimum pitch features on a dynamic random access memory chip (DRAM). In an unrepaired mask the spacing between these features is controlled solely by the mask specifications for pattern placement and possibly by the phase specification. If one of two adjacent features is imaged by the phase shifting repair mask and one by the original phase shifting mask, there will be an additional error in the feature to feature spacing that depends on whatever repair mask to phase shifting mask misalignment is present. As explained above, this misalignment is expected to be small. In such a case, an additional evaluation of the overlay impact of the repair will have to be made to see if there is any electrical impact or if the impact can be corrected by a design modification. Therefore, the positioning accuracy can be on the order of 50 nanometers which is comparable if not better than that of either focused ion beam or laser repair. When there is no defect near edges, a high superposition accuracy is not required.

While the invention has been particularly shown and described with respect to preferred embodiments thereof, it will be understood by those skilled in the art that changes in form and details may be made therein without departing from the scope and spirit of the invention.

What is claimed is:

1. A method of correcting a plurality of defects in an image enhancing mask, comprising the steps of:
   a) locating the plurality of defects;
   b) defining a plurality of repair regions;
   c) making the plurality of repair regions opaque on the image enhancing mask; and
   d) defining a pattern on an image enhancing repair mask to complement the plurality of repair regions.

2. The method of claim 1 wherein the image enhancing mask comprises phase shift openings and non-phase shift openings.

3. The method of claim 1 wherein said plurality of defects are located using AIMs.

4. The method of claim 1 wherein said plurality of repair regions are defined using a CAD/CAM system.

5. The method of claim 1 wherein the image enhancing mask performs a trimming function.

6. The method of claim 1 wherein the image enhancing repair mask performs a repair function, a trimming function, and a design function.

7. The method of claim 1 wherein the image enhancing repair mask performs a design function.

8. The method of claim 1 wherein said plurality of repair regions terminate in noncritical regions.

9. The method of claim 1 wherein said plurality of repair regions include circuitry.

10. The method of claim 1 wherein the plurality of defects comprise misplaced chrome and phase shift errors.

11. A method of correcting a plurality of defects in a phase shifting mask used to expose an image on a semiconductor wafer comprising the following steps:
   a) detecting the plurality of defects in a pattern of the phase shifting mask;
   b) defining a plurality of repair regions surrounding each of said plurality of defects that need to be repaired;
   c) making the plurality of repair regions opaque;
   d) defining a pattern on a phase shift repair mask to complement the plurality of repair regions;
   e) adjusting the pattern on the phase shift repair mask to align phase shifting edges;
   f) exposing the phase shifting mask onto the semiconductor wafer; and
   g) exposing the phase shifting repair mask onto the semiconductor wafer.

12. The method of claim 11, wherein a positive photoresist is used on the semiconductor wafer.

13. The method of claim 11, wherein a negative photoresist is used on the semiconductor wafer.

14. The method of claim 11, wherein each of said exposing steps is immediately followed by a development step.

15. The method of claim 11, wherein one development step follows all of said exposure steps.

16. A method of correcting a plurality of defects in a phase shift mask used to expose an image on a semiconductor wafer comprising the following steps:
   a) detecting the plurality of defects in the phase shift mask;
   b) defining a plurality of repair regions surrounding each of said plurality of defects that need to be repaired;
   c) making the plurality of repair regions opaque;
   d) defining a pattern on a phase shift repair mask to complement the plurality of repair regions;
   e) adjusting the phase shift repair mask;
   f) exposing the phase shift repair mask onto the semiconductor wafer; and
   g) exposing the phase shift mask onto the semiconductor wafer.

17. The method of claim 16, wherein each said exposing step is immediately followed by a development step.

18. The method of claim 16, wherein all of the exposing steps are completed before a development step.

19. A method of correcting a plurality of defects in a phase shifting mask used to expose an image on a semiconductor wafer comprising the following steps:
   a) detecting the plurality of defects in the phase shifting mask;
   b) defining a plurality of repair regions surrounding each of said plurality of defects that need to be repaired;
   c) making the plurality of repair regions opaque;
   d) defining a pattern on a phase shift repair mask to complement the plurality of repair regions;
   e) adjusting the phase shift repair mask;
   f) defining the area on the phase shift repair mask that needs to be trimmed;

g) defining a pattern on the trim mask to complement the trim area;

h) exposing the phase shift mask onto the semiconductor wafer;

i) exposing the phase shift repair mask onto the semiconductor wafer; and j) exposing the trim mask onto the semiconductor wafer.

20. The method of claim 19 wherein each said exposing step is immediately followed by a development step.

21. The method of claim 19 wherein a development step follows the completion of all the said exposing steps.

22. A phase shift mask system comprising:

a phase shift mask including a plurality of phase shift openings, a plurality of non-phase shift openings, and a plurality of defects; and a phase shift repair mask including a plurality of repair areas which operatively cooperate with the plurality of defects in the phase shift mask.

23. The phase shift mask system of claim 22 wherein the phase shift openings are alternating phase shifting openings.

24. The phase shift mask system of claim 22 wherein the phase shift openings are rim phase shifting openings.

25. The phase shift mask system of claim 22 wherein the phase shift openings are subresolution phase shifting openings.

26. The phase shift mask system of claim 22 wherein the phase shift openings are phase edge shifting openings.

27. The phase shift mask system of claim 22 wherein the phase shift openings are attenuated phase shifting openings.

28. The phase shift mask system of claim 22 wherein the phase shift openings are unattenuated phase shifting openings.

29. The phase shift mask system of claim 22 wherein the phase shift mask and the phase shift repair mask each include subresolution imaging with unattenuated phase shift openings.

30. The phase shift mask of claim 22, wherein the phase shift openings are chromeless phase shifting openings.

31. The phase shift mask of claim 22, wherein the phase shifting openings are Levenson phase shifting openings.

32. The phase shift mask of claim 22, wherein the phase shifting openings include outrigger phase shifting openings.

33. The phase shift mask system of claim 22, wherein the phase shift openings are used selectively depending on the critical image contrast requirement.

34. The phase shift repair mask of claim 22, wherein said phase shifting repair mask comprises phase shifters and intensity mask elements.

35. The phase shift mask system of claim 22, wherein the plurality of repairing areas include circuitry.

36. The phase shift mask system of claim 22, wherein the phase shift repair mask includes trim areas and second design areas.

37. A phase shift mask system comprising:

a phase shift mask including a plurality of phase shift openings, a plurality of non-phase shift openings, and a plurality of defects;

a phase shifting repair mask including a plurality of repair areas which operatively cooperate with the plurality of defects in the phase shifting mask; and a trim mask which operatively cooperates with the phase shifting repair mask.

38. A method of collecting a plurality of defects, comprising the steps of:

a) locating the plurality of defects;

b) defining a plurality of repair regions;

c) making the plurality of repair regions opaque on a mask which includes an image enhancing mask section and a image enhancing repair mask section; and d) defining a pattern on the image enhancing repair mask section to complement the plurality of repair regions.

39. The method of claim 38, wherein the image enhancing mask section and the image enhancing repair mask section are located on one mask.

40. A method of correcting a plurality of defects comprising the following steps:

a) detecting the plurality of defects in a pattern of a phase shift mask section;

b) defining a plurality of repair regions surrounding each of said plurality of defects that need to be repaired;

c) making the plurality of repair regions opaque;

d) defining a pattern on a phase shift repair mask section to complement the plurality of repair regions;

e) adjusting the pattern on the phase shift repair mask section to align phase shifting edges;

f) exposing the phase shift mask section onto the semiconductor wafer; and g) exposing the phase shift repair mask section onto the semiconductor wafer.

41. The method of claim 40, wherein the phase shift mask section and phase shift repair mask section are located on one mask.

42. A method of correcting a plurality of defects comprising the following steps:

a) detecting the plurality of defects in a phase shift mask section;

b) defining a plurality of repair regions surrounding each of said plurality of defects that need to be repaired;

c) making the plurality of repair regions opaque;

d) defining a pattern on a phase shift repair mask section to complement the plurality of repair regions;

e) adjusting the phase shift repair mask section;

f) exposing the phase shift repair mask section onto the semiconductor wafer; and g) exposing the phase shift mask section onto the semiconductor wafer.

43. The method of claim 42, wherein the phase shift mask section and the phase shift repair mask section are located on one mask.

44. A method of correcting a plurality of defects comprising the following steps:

a) detecting the plurality of defects in a phase shift mask section;

b) defining a plurality of repair regions surrounding each of said plurality of defects that need to be repaired;

c) making the plurality of repair regions opaque;

d) defining a pattern on a phase shift repair mask section to complement the plurality of repair regions;

e) adjusting the phase shift repair mask section;

f) defining the area on the phase shift repair mask section that needs to be trimmed;

g) defining a pattern on a trim mask section to complement a trim area;

h) exposing the phase shift mask section onto the semiconductor wafer;

i) exposing the phase shift repair mask section onto the semiconductor wafer; and j) exposing the trim mask section onto the semiconductor wafer.

45. The method of claim 44, wherein the phase shift mask section, the phase shift repair section, and the trim mask section are located on one mask.

46. A phase shift mask system comprising:

a phase shift mask section including a plurality of phase shift openings, a plurality of non-phase shift openings, and a plurality of defects; and a phase shift repair mask section including a plurality of repair areas which operatively cooperate with the plurality of defects in the phase shift mask.

47. The phase shift mask system of claim 46, wherein the phase shift mask section and the phase shift mask repair section are located on one mask.

* * * * *